US012586626B2

(12) United States Patent
Nale

(10) Patent No.: US 12,586,626 B2
(45) Date of Patent: Mar. 24, 2026

(54) RANDOMIZATION OF DIRECTED REFRESH MANAGEMENT (DRFM) PSEUDO TARGET ROW REFRESH (PTRR) COMMANDS

(71) Applicant: Intel Corporation, Santa Clara, CA (US)

(72) Inventor: Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 782 days.

(21) Appl. No.: 17/830,045

(22) Filed: Jun. 1, 2022

(65) Prior Publication Data

US 2022/0293162 A1      Sep. 15, 2022

(51) Int. Cl.
G06F 3/06 (2006.01)
G11C 11/406 (2006.01)

(52) U.S. Cl.
CPC ............ G11C 11/406 (2013.01); G06F 3/061 (2013.01); G06F 3/0659 (2013.01); G06F 3/0673 (2013.01)

(58) Field of Classification Search
CPC ...... G06F 3/061; G06F 3/0659; G06F 3/0673; G06F 3/00; G06F 11/00; G06F 21/00; G06F 2101/00; G06F 2113/00
See application file for complete search history.

(56) References Cited

U.S. PATENT DOCUMENTS

| | | | |
|---|---|---|---|
| 9,236,110 B2 | 1/2016 | Bains et al. | |
| 9,449,671 B2 | 9/2016 | Crawford et al. | |
| 10,636,476 B2 | 4/2020 | Nale | |
| 11,282,561 B2 | 3/2022 | Nale et al. | |
| 2014/0059287 A1* | 2/2014 | Bains ................ G11C 11/40622 |
| | | | 711/106 |
| 2017/0103795 A1 | 4/2017 | Crawford et al. | |
| 2018/0190342 A1 | 7/2018 | Morgan et al. | |
| 2019/0228813 A1* | 7/2019 | Nale ..................... G06F 3/0619 |
| 2019/0362774 A1 | 11/2019 | Kuramori et al. | |
| 2023/0124182 A1* | 4/2023 | Chen ..................... G06F 3/0659 |
| | | | 365/185.05 |

* cited by examiner

*Primary Examiner* — Yong J Choe
(74) *Attorney, Agent, or Firm* — Compass IP Law PC

(57) ABSTRACT

In a memory subsystem, a controller can randomize the sending of directed refresh management (DRFM) commands for DRFM commands that hit multiple banks at a time. The controller can generate commands to indicate the memory device should capture addresses for various banks to use for pseudo target row refresh (pTRR) operations based on addresses associated with activate commands. The controller can randomize the indication of address capture for the memory device. With captured addresses and DRFM commands generated at random, the system can make better use of DRFM commands because the multiple banks are more likely to have addresses for pTRR, and randomization can reduce the ability for a row hammer attack to avoid the DRFM.

25 Claims, 12 Drawing Sheets

COMMAND 700

| ENCODING 710 | ADDRESS 720 | CAPTURE 730 |
|---|---|---|

RANDOMIZATION OF DIRECTED REFRESH MANAGEMENT (DRFM) PSEUDO TARGET ROW REFRESH (PTRR) COMMANDS

FIELD

Descriptions are generally related to memory subsystems, and more particular descriptions are related to refresh commands.

BACKGROUND

Volatile memory devices, such as DRAM (dynamic random access memory) devices, have a known attack vector referred to as row hammer or row disturb. A row hammer attack can refer to a failure caused by repeated access to a target row or aggressor row within a time period, which causes a change in value of a victim row that is adjacent or proximate to the target/aggressor row. Repeated activation of the target row causes migration of charge across the passgate of the victim row. With repeated manipulation of a target row with a known pattern, an attacker can intentionally flip bits of victim rows.

Emerging memory devices are primarily responsible for row hammer mitigation, with host assistance through the host providing periods of refresh time to allow the memory devices to perform internal refresh. The host assistance can be in the form of directed refresh management (DRFM) commands. Pseudo target row refresh (pTRR) is a technique in which the memory device pseudorandomly captures addresses as the aggressor for target row refresh operations based on Activates, under the theory that rows experiencing sufficient Activates to cause victim row disturb are likely to be selected for row hammer mitigation by the memory device. However, there is not much randomness in the technique, which can allow an attacker to maneuver around the protections.

The pTRR pseudorandom selection of activate commands would work best if the DRFM command affected only a single bank. However, directing DRFM commands to a single bank is considered too costly for bandwidth, and emerging DRFM commands are directed to either all banks or the same bank in all bank groups. DRFM all bank (DRFMab) and DRFM same bank (DRFMsb), there is a high likelihood a bank will not have a row selected for pTRR when a DRFM command is received, which wastes the DRFM command for those banks.

With the performance impact of DRFM commands, some systems choose not to implement DRFM, leaving all row hammer mitigation to the memory devices without host support. While such an approach minimizes the performance impact, it increases the exposure to row hammer attacks. Alternatively, a system can employ DRFM commands to reduce exposure to row hammer attacks, which can have a significant performance impact, especially as DRFM commands are directed to multiple banks.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
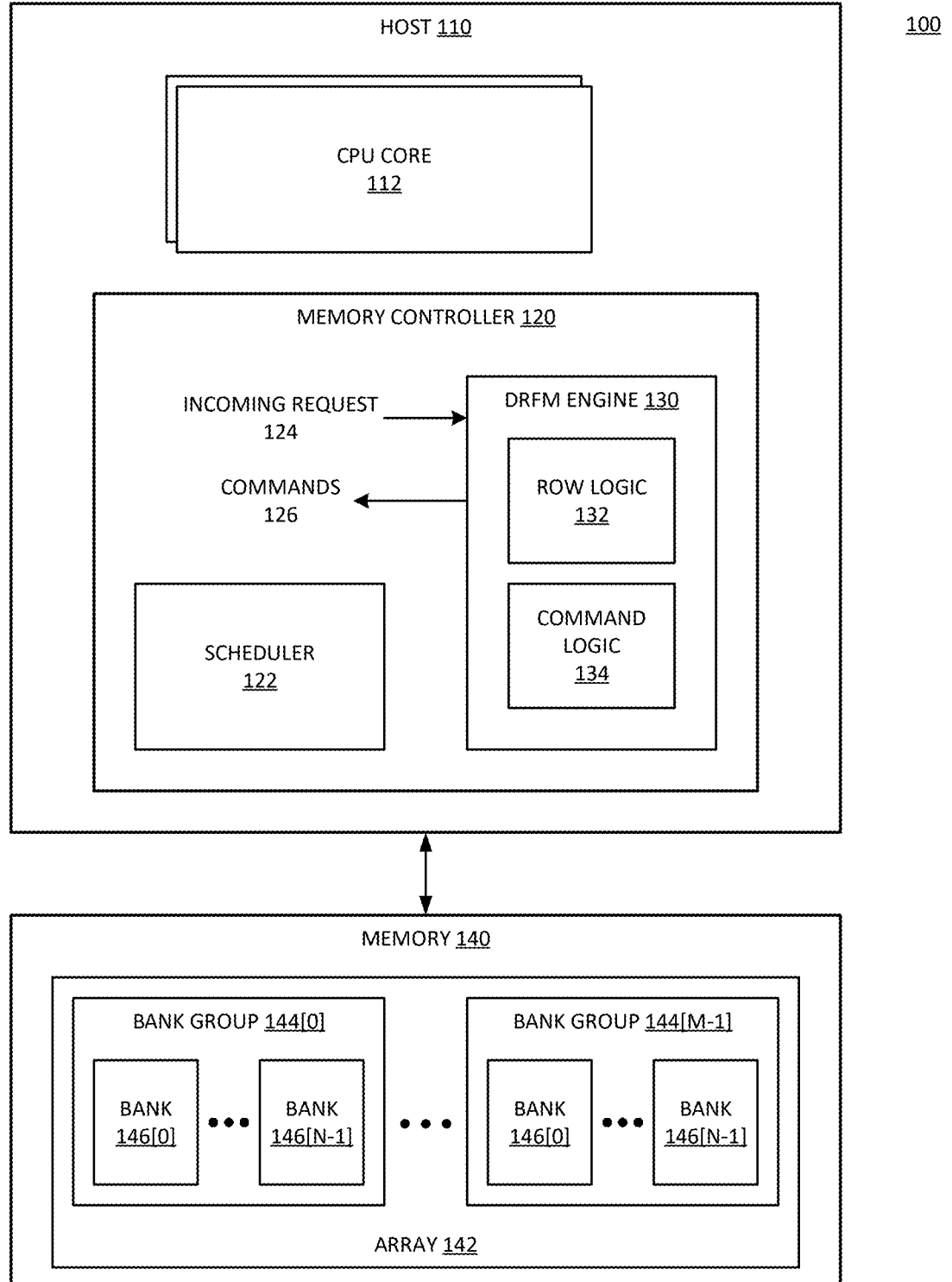
FIG. 1 is a block diagram of an example of a system with row hammer mitigation based on randomized address selection.

Descriptions of certain details and implementations follow, including non-limiting descriptions of the figures, which may depict some or all examples, and well as other potential implementations.

DETAILED DESCRIPTION

Generally, row hammer is a condition where repeated access to a target row or aggressor row can cause row disturb that changes data in adjacent rows or victim rows. The repeated activation of an aggressor row can change the victim rows even when the victim rows are not being activated. Row hammer is typically discussed with reference to dynamic random access memory (DRAM) devices. DRAM devices attempt to perform row hammer mitigation with proprietary mechanisms, which can mitigate known attacks. However, even as one mitigation mechanism is introduced, new, more sophisticated attacks are introduced
that can thwart the mitigation.

Many memory systems employ pseudo target row refresh
(pTRR), which enables the host to select activate commands
in a pseudorandom manner to provide to the DRAM devices.
The DRAM devices can then perform internal row hammer
mitigation based on the selected address, without the host
needing to know about internal swizzling techniques or row
repairs that result in different row adjacencies for row
hammer purposes. Thus, the DRAM devices can internally
track row adjacencies and perform row hammer mitigation
based on a selected activate command address. In theory, the
host will likely select an aggressor address with pTRR,
seeing that many activates will be needed to complete a row
hammer attack.

Directed refresh management (DRFM) allows the host
controller to specify an aggressor address for the DRAM
devices to use for row hammer mitigation by internally
refreshing potential victim rows. The memory controller
will typically select an address pseudorandomly with pTRR,
and follow the address selection with a DRFM command to
trigger the DRAM devices to perform mitigation operations.
DRFM is limited to DRFM all bank (DRFMab) or DRFM
same bank (DRFMsb) in double data rate version 5 (DDR5),
meaning a DRFM command will hit multiple banks (e.g., 32
banks (DRFMab) or 8 of 32 banks (DRFMsb)). Thus,
specifying the same aggressor row with DRFM is too
predictable, enabling a row hammer attack vector to avoid
the mitigation operations.

As described herein, in a memory subsystem where
directed Refresh management (DRFM) commands are sent
to either all banks (DRFMab) or to the same bank in all bank
groups (DRFMsb), the memory controller can randomize
the sending of the DRFM commands. The controller can
generate commands to indicate the memory device should
capture addresses for various banks to use for pTRR opera-
tions. The indication can be based on addresses associated
with activate commands or Activates. The controller can
send an indication for every Activate or can randomize the
indication of address capture by an indication for selected
Activates, such commands selected pseudorandomly. With
captured addresses (whether captured for every Activate or
for selected Activates) and DRFM commands generated at
random, the system can make better use of DRFM com-
mands because the multiple banks are more likely to have
addresses for pTRR, and randomization can reduce the
ability for a row hammer attack to avoid the DRFM.

In contrast to systems that do not use DRFM because of
the performance impact, a system can randomize the sending
of the DRFM, with different rows selected for each bank.
Thus, the host does not need to know the address swizzling
employed by the memory devices, and does not need to
account for repaired rows, allowing such factors to be
handled internally by the memory device or DRAM device.

In contrast to systems that use DRFM with a performance
impact due to only one bank being the target of the DRFM
command, but having to trigger mitigation in many banks,
the system can randomize the sending of the DRFM and
allow different rows to be selected for each bank. Thus, the
memory device or DRAM device will have addresses for
different banks to perform mitigation, increasing the likeli-
hood that the mitigation operations have a benefit. Instead of
using memory bandwidth without a benefit, increasing the
utility of the DRFM command means the command is more
likely to provide a beneficial result for all banks affected by
the command. Better use of the bandwidth required to perform row hammer mitigation, increases the possibility to
mitigate more types of attacks with less bandwidth loss.

FIG. 1 is a block diagram of an example of a system with
row hammer mitigation based on randomized address selec-
tion. System 100 represents elements of a computing system
with a host processor coupled to memory resources. System
100 enables host-assisted row hammer mitigation by the
memory, based on randomized multibank DRFM commands
that can increase mitigation operations to more banks.

Host 110 represents a host hardware platform for system
100. Host 110 can include central processing unit (CPU)
core 112 and memory controller 120. CPU core 112 repre-
sents an execution core that performs operations that gen-
erate memory access requests. CPU core 112 can be part of
a single core processor or a multicore processing, which
includes separate execution units. CPU cores 112 can per-
form operations in parallel and send memory access requests
to memory controller 120. The execution of operations can
generate changes to data that will be stored in memory, and
the execution of operations can request data for execution
that will request data stored in memory. Memory 140
represents memory for system 100, and can be or include
DRAM devices. Memory 140 can represent multiple sepa-
rate memory devices, such as multiple DRAM devices in a
dual inline memory module (DIMM).

Memory 140 includes array 142 with M bank groups,
bank group 144[0:M–1], collectively, bank groups 144.
Each bank group 144 can include N banks, bank 146[0:N–
1], collectively, banks 146. Array 142 represents the memory
array to store data. Memory 140 stores data in array 142
based on row address, column address, bank address, bank
group, and rank. Rank is typically addressed by chip select
(CS #). Memory 140 connects with host 110 via a command
bus for commands and a data bus to exchange data. Memory
140 can represent multiple memory devices coupled to the
data bus.

CPU core 112 provides requests for data access to
memory controller 120. Memory controller 120 manages
access to memory 140. Memory controller 120 receives
memory access requests for CPU core 112 and generates
commands to access memory 140. Memory controller 120
can identify physical addresses for host addresses in the
requests from CPU core 112.

In one example, memory controller 120 includes sched-
uler 122 to schedule commands for accesses to memory 140.
The commands can include activate commands, precharge
commands, read commands, write commands, and other
commands. In one example, memory controller 120 includes
control circuitry to generate one or more commands to
indicate addresses for at least some of banks 146 to capture
for a pTRR operation or a row hammer mitigation operation
by banks 146. The control circuitry can generate the com-
mands for scheduling by scheduler 122. In one example, the
commands indicate addresses for all banks. The commands
can indicate the addresses for the banks one bank at a time
as the memory access requests request access to the different
banks.

In one example, the control circuitry can generate a
DRFM command to trigger memory 140 to perform target
row refresh mitigation for the addresses selected for multiple
or all of banks 146. The control circuitry of memory
controller 120 can randomize how frequently to send the
DRFM command to memory 140.

In one example, the control circuitry can be represented at
least partially by DRFM engine 130. DRFM engine 130
represents control circuitry within memory controller 120 to
randomize selection of the DRFM commands. In one example, DRFM engine 130 can be implemented at least partially in firmware or software logic implemented on the hardware of memory controller 120.

As illustrated, DRFM engine 130 can receive incoming request 124, which represents a request for memory access generated by CPU core 112. DRFM engine 130 can generate commands 126. Commands 126 can represent the commands to indicate the addresses for pTRR operation. Commands 126 can represent the DRFM commands to trigger memory 140 to perform row hammer mitigation operations.

In one example, DRFM engine 130 includes row logic 132. Row logic 132 represents logic to select a row address as an aggressor row. Row logic 132 can select the address to provide to memory 140 through commands 126 via scheduler 122. In one example, row logic 132 generates addresses per bank 146 of array 142. Command logic 134 represents logic to generate commands 126. In one example, commands 126 include precharge commands to indicate the selected address or selected aggressor row. The precharge command can include a standard precharge (PRE), a read with auto-precharge command (RDA), or a write with auto-precharge command (WRA).

In one example, the precharge command can include a bit or a field as an indicator of whether memory 140 should capture the address associated with the command for later mitigation operations. Whether through an indicator field or indicator bit in the command, or some other indicator, memory 140 can capture the address associated with a command. Capturing the address can refer to storing the address in a register or storage to use as the address for a subsequent mitigation operation. Thus, when memory controller 120 generates a DRFM command, memory 140 can access the captured address for each row and perform the mitigation operations based on the selected rows as the aggressor rows. In one example, memory 140 will use only the last address selected for a bank for mitigation in response to a DRFM command.

Figure 2:
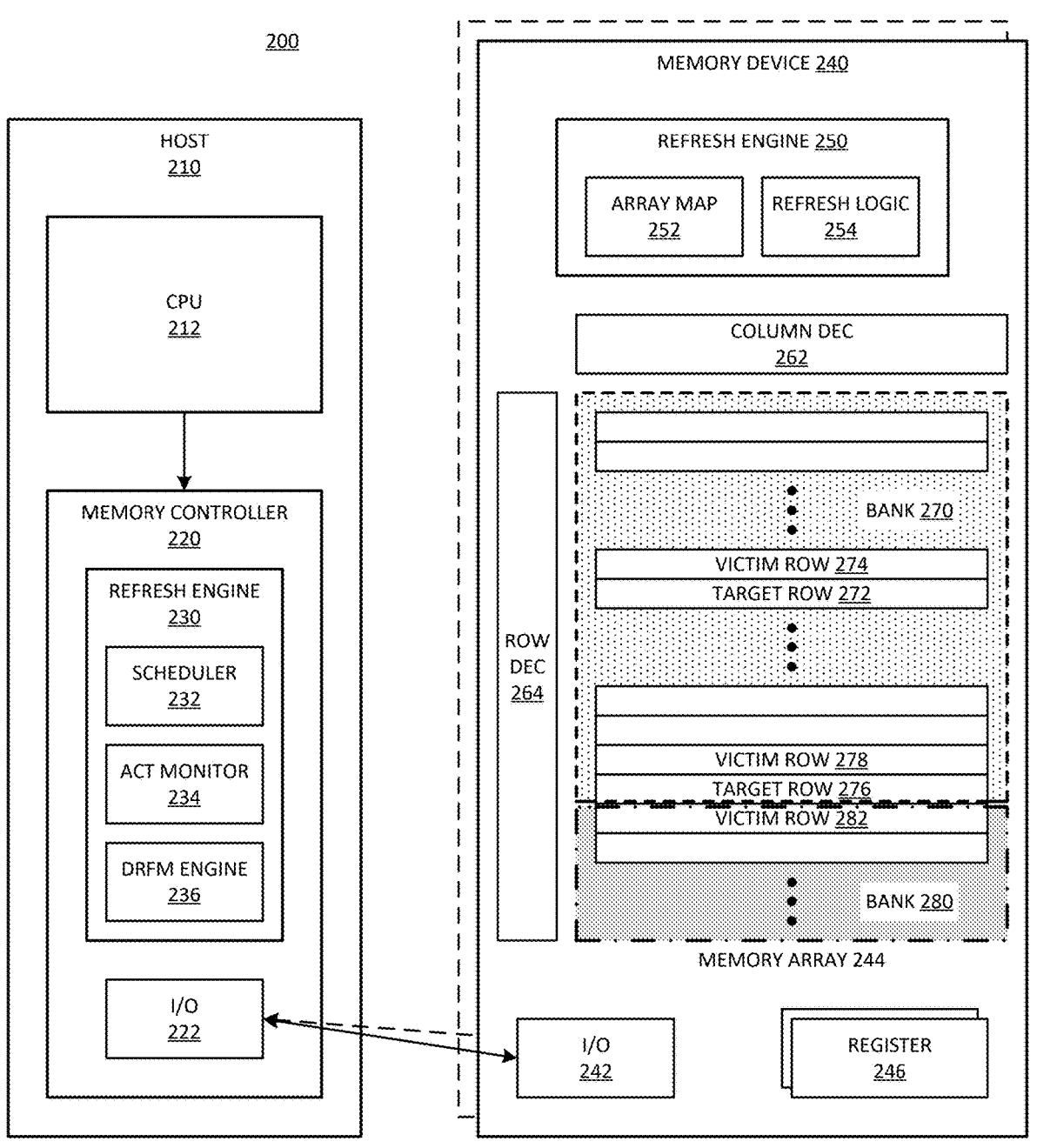
FIG. 2 is a block diagram of an example of a system that performs row hammer mitigation based on randomized addresses based on Activate monitoring.

FIG. 2 is a block diagram of an example of a system that performs row hammer mitigation based on randomized addresses based on Activate monitoring. System 200 represents a system in accordance with an example of system 100.

System 200 includes memory device 240 coupled to memory controller 220. Memory device 240 can include any type of memory technology that has adjacent rows of memory cells, where data is accessible via a wordline or the equivalent. In one example, memory device 240 includes DRAM technology. In one example, system 200 includes multiple memory devices 240.

Memory controller 220 is part of host 210, which represents a host system of which memory device 240 is part. Host 210 includes CPU 212, which represents one or more processors or processing resources for the host. CPU 212 generates memory access requests for memory device 240. Memory controller 220 can be an integrated memory controller, which is part of the CPU die, or a discrete component coupled to the CPU die. While shown as a CPU, alternatively, CPU 212 can be a graphics processing unit (GPU), an accelerator processor, or other processing component.

Memory device 240 includes memory array 244, which represents an array of memory cells or storage cells. A memory cell stores a bit of data, or multiple bits for a multilevel cell. Memory array 244 includes a representation of potential row hammer conditions. For purposes of example, memory array 244 shows bank 270 and bank 280. It will be understood that memory array 244 can include multiple banks. In general, a bank or a sub-bank of memory includes memory cells that are addressable separately from memory cells of another bank or sub-bank.

Memory device 240 includes column decoder (DEC) 262 which represents circuitry to apply charge to a column based on an access command. In one example, the circuitry selects a column in response to a column address strobe (CAS) command. Memory device 240 includes row decoder (DEC) 264 which represents circuitry to apply selection voltages to rows based on a memory access command. In one example, the circuitry selects a column in response to a row address strobe (RAS) command.

For an illustration of a row hammer condition, memory array 244 includes target row 272 in bank 270. A physically proximate row or a physically adjacent row can suffer from unintentional programming or disturb of one or more values stored in the row based on repeated access to target row 272 within a time period prior to a refresh operation on the row. The repeated access results in charge migration based on ones in the target row adjacent zeros in the victim row.

Victim row 274 represents a row that is subject to row hammer when target row 272 is repeatedly accessed. When victim row 274 is at risk of a row hammer event, target row 272 can be referred to as an aggressor row. There may be another row in bank 270 that is a victim row to target row 272.

In one example, bank 270 also includes target row 276. Consider that target row 276 is at or near a bank boundary. It will be understood that the rows in memory array 244 may have a spacing that is not different even if the rows are in different banks or sub-banks. Rather, the separation of one bank or sub-bank to another can be defined by selection or decode hardware elements. Thus, depending on the architecture of the physical layout of the rows, a row on the boundary of bank 280 could also be at risk for a row hammer event based on access to target row 276. In one example, repeated access to a target row can cause a disturb of multiple adjacent rows. In as illustrated, target row 276 can result in row hammer events to both victim row 278 of bank 270 and victim row 282 of bank 280.

To avoid a row hammer condition due to access to target row 272, memory device 240 can perform refresh of the potential victim rows, such as victim row 274. Similarly, memory device 240 can perform refresh of victim row 278 and victim row 282 to avoid a row hammer condition due to repeated access to target row 276.

In one example, memory controller 220 includes refresh engine 230 to manage refresh of memory device 240. Refresh engine 230 can be executed at least partially as hardware logic within memory controller 220. In addition to hardware circuitry, refresh engine 230 can include firmware or software logic.

Refresh engine 230 can include scheduler 232, which represents logic in refresh engine 230 to schedule refresh commands to maintain bitcells of memory array 244 in a determinate state, such as by scheduling refresh of rows within a refresh window. In one example, refresh engine 230 includes Activate (ACT) monitor 234. Activate monitor 234 can enable memory controller 220 to monitor activate commands sent to banks of memory array 244. In one example, Activate monitor 234 monitors Activates per bank. In one example, Activate monitor 234 monitors Activates per row. Refresh engine 230 can include a register or counter to enable Activate monitor 234 to track Activates.

In one example, refresh engine 230 includes directed refresh management (DRFM) engine 236. DRFM engine 236 can determine when to send DRFM commands to memory device 240 to trigger the memory device to perform targeted refresh of suspected aggressor rows. In one example, DRFM engine 236 randomizes the sending of the DRFM commands based on an Activate count generated by Activate monitor 234.

I/O (input/output) 222 represents a hardware interface of memory controller 220 to connect to memory device 240. I/O 222 can include pins, pads, signal lines, drivers, receivers, or other hardware, or a combination of hardware components. I/O 222 can be controlled by control logic that configures and manages termination and driver components. I/O 242 represents I/O on memory device 240. Memory device 240 can interface with memory controller 220 via I/O 242 of memory device 240 and I/O 222 of memory controller 220. I/O 222 and I/O 242 provide interface hardware to couple to a data bus that interconnects memory controller 220 with memory device 240.

Memory controller 220 can send Activate commands via I/O 222 as part of accesses to memory array 244. Memory device 240 can receives the Activate commands via I/O 242, decode the commands, and access memory array 244 at the address associated with the command. In one example, memory controller 220 sends DRFM commands in a randomized manner to memory device 240 to trigger row hammer mitigation by the memory device. Randomization of the DRFM commands can refer to a frequency of sending of the commands, where memory controller 220 can send a DRFM command once per period of time on average, where the specific timing within the window is randomized to avoid knowing specifically when the command will be issued. By randomizing the sending of the DRFM command, a row hammer attack cannot expect the command at any given time, which can significantly decrease the chance of success of the row hammer attack.

In one example, memory controller 220 indicates addresses per bank for memory device 240 to capture to use when memory controller 220 sends the DRFM command.

Memory device 240 includes register 246, which represents one or more registers or storage locations to store configuration information or values related to the operation of memory device 240. In one example, register 246 includes one or more mode registers. In one example, register 246 includes configuration information to control the operation memory device 240.

In one example, register 246 represents one or more registers for memory device 240 to store or capture addresses for use in response to a DRFM command. In one example, register 246 includes a register or a register location per bank to store a row address to use as the basis of row hammer mitigation in response to the DRFM command. The captured row address can be considered the aggressor row, and memory device 240 will refresh adjacent rows to the captured address to attempt to mitigate row hammer conditions.

In one example, memory device 240 includes refresh engine 250, which can include hardware circuitry for refresh operations. Refresh engine 250 can include firmware or other software in addition to hardware logic for refresh. In one example, at least a portion of refresh engine 250 is implemented as part of an internal controller or control logic on memory device 240.

In one example, refresh engine 250 includes array map 252, which can represent a mapping of memory array 244. While memory controller 220 does not necessarily know what swizzling algorithm memory device 240 employs, array map 252 can allow refresh engine 250 to know adjacencies of rows for purposes of performing row hammer mitigation refresh operations. Refresh engine 250 can include refresh logic 254 to perform internal refresh operations, which can include row hammer mitigation refresh operations.

Figure 3A:
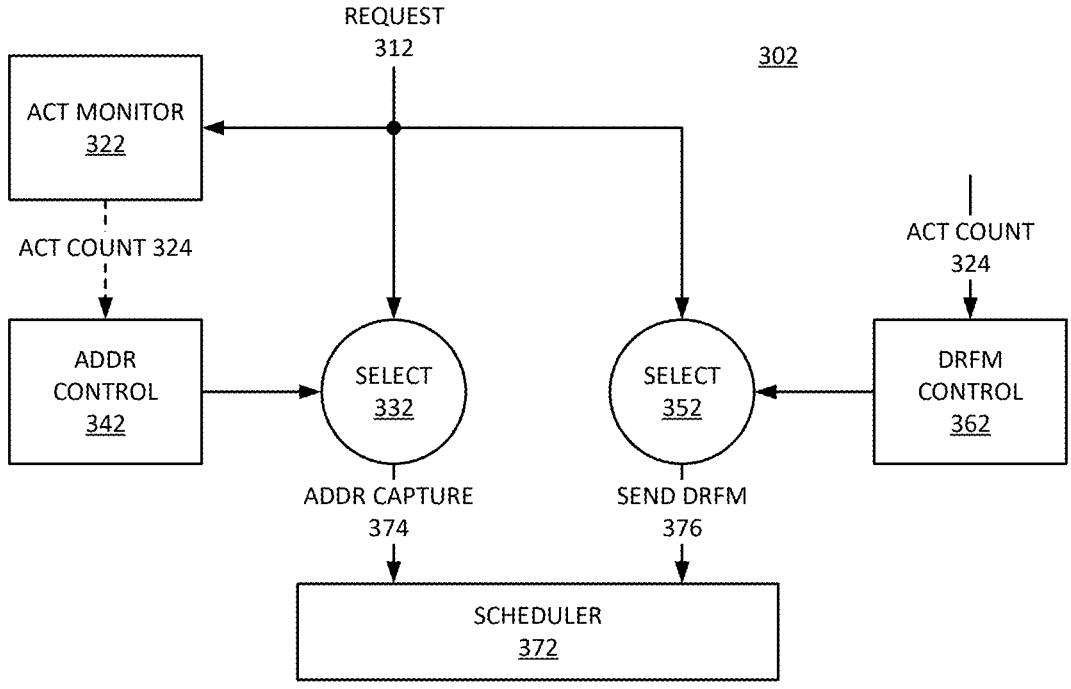
FIG. 3A is a block diagram of an example of a system that provides row hammer mitigation based on randomized DRFM selection based on Activate monitoring.

FIG. 3A is a block diagram of an example of a system that provides row hammer mitigation based on randomized DRFM selection based on Activate monitoring. System 302 represents components of a memory controller, such as memory controller 120 of system 100 or memory controller 220 of system 200.

System 302 receives request 312, which represents a request for memory access generated by a host processor or processing core. In one example, system 302 includes Activate (ACT) monitor 322 to monitor Activates to memory. In one example, Activate monitor 322 generates a count of Activates to different banks of memory. Activate (ACT) count 324 represents the count, which can be specific to each bank. Thus, Activate count 324 can be different for each incoming request 312 based on the bank indicated in request 312. Request 312 includes an address (e.g., a row address) associated with it, to indicate a row of memory to access, which will have an associated bank address.

System 302 includes select 332, which represents a selection circuit to determine when to generate an address capture indication for the address associated with request 312. Select 332 can be controlled by address (ADDR) control 342. Address control 342 provides a signal or a control for select 332 when the address of request 312 should be selected for capture. In one example, address control 342 can cause select 332 to select every address for every request, which will trigger the memory device to overwrite the DRFM aggressor address on every new request 312. In one example, address control 342 randomizes the control of select 332. Address control 342 can receive Activate count 324 from Activate monitor 322 and randomly trigger select 332 based on the count. Thus, select 332 can randomly indicate the address to the memory device for capture.

Address (ADDR) capture 374 represents an address capture indication when select 332 selects an address for capture. In one example, address capture 374 triggers an activate command in scheduler 372 to have a flag set or a field populated to indicate address capture to the memory device. Thus, when the memory device receives and decodes the command, it can identify the address capture trigger and store the address for a subsequent DRFM mitigation operation.

System 302 includes select 352, which represents a selection circuit to determine when to select request 312 as a trigger for a DRFM command. DRFM control 362 represents control to cause select 352 to generate the DRFM command. Send DRFM 376 represents the DRFM command or a control signal to trigger generation of the DRFM command. System 302 can cause provide the DRFM command to scheduler 372 to schedule to send to the memory device.

DRFM control 362 can randomize the generation of the DRFM command based on Activate count 324. With Activate count 324 as an input, DRFM control 362 can pseudorandomly trigger select 352. Randomization of select 352 will mean the exact timing of DRFM command should be unknowable to an attacker attempting a row hammer attack.

Scheduler 372 can represent the scheduler of the memory controller. Scheduler 372 will schedule access commands to send to the memory device. The access commands are not explicitly shown in system 302. Request 312 will have an access command or commands associated with it. Such commands can include an activate command, which can be configured to trigger address capture based on select 332.

Address capture 374 can represent a command to be scheduled by scheduler 372, or the setting of a field in an access command to indicate address capture. Send DRFM 376 represents that scheduler 372 will have a DRFM command to schedule to send to the memory device.

In one example, address control 342 represents a linear feedback shift register (LFSR) with high insertion rate. The high insertion rate can be on the order of single digits or double digits of commands. Thus, on average, every so many Activates as indicated by Activate count 324, address control 342 can generate a signal to cause select 332 to select the address of request 312 for capture.

In one example, DRFM control 362 represents an LFSR with a lower insertion rate. The lower insertion rate can be an order of magnitude or two orders of magnitude less frequent than the insertion rate of address control 342. The lower insertion rate can be on the order of 1 out of every 200 or 1 out of every 500 requests. The lower insertion rate can be less frequent than 1 out of 500. In general, the lower insertion rate triggers DRFM commands with less frequency than the higher insertion rate triggers address capture indications or address capture commands.

In one example, address control 342 triggers select 332 on every request 312. Thus, scheduler 372 can indicate address capture to the memory device for every activate command. Therefore, system 302 can have a configuration as control circuitry that randomizes the generation of an address capture command and randomizes the generation of the DRFM command. Alternatively, system 302 can have a configuration as control circuitry that randomizes the generation of the DRFM command and generates an address capture command in a non-randomized manner, which can be every command or every other command, every third command, or so forth.

In one example, the insertion rate of address control 342 is configurable or programmable by the platform basic input/output system (BIOS). In one example, the BIOS can configure or program the insertion rate of DRFM control 362.

Figure 3B:
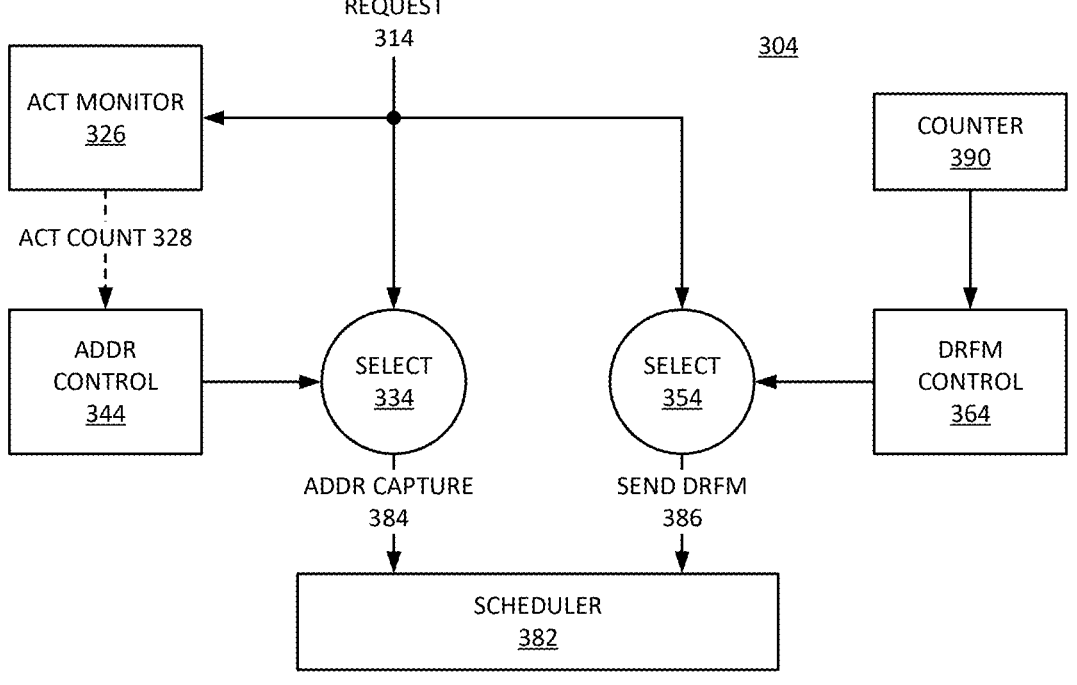
FIG. 3B is a block diagram of an example of a system that provides row hammer mitigation based on randomized DRFM selection based on a randomized counter.

FIG. 3B is a block diagram of an example of a system that provides row hammer mitigation based on randomized DRFM selection based on a randomized counter. System 304 represents components of a memory controller, such as memory controller 120 of system 100 or memory controller 220 of system 200. Whereas system 302 above provides randomization of the DRFM command based on Activate count, system 304 provides randomization of the DRFM command based on a counter or timer.

It will be understood that the description of most elements of system 304 is the same as the descriptions above with respect to system 302 for similar elements. The descriptions are repeated here for completeness.

System 304 receives request 314, which represents a request for memory access generated by a host processor or processing core. In one example, system 304 includes Activate (ACT) monitor 326 to monitor Activates to memory. In one example, Activate monitor 326 generates a count of Activates to different banks of memory. Activate (ACT) count 328 represents the count, which can be specific to each bank. Thus, Activate count 328 can be different for each incoming request 314 based on the bank indicated in request 314. Request 314 includes an address (e.g., a row address) associated with it, to indicate a row of memory to access, which will have an associated bank address.

System 304 includes select 334, which represents a selection circuit to determine when to generate an address capture indication for the address associated with request 314. Select 334 can be controlled by address (ADDR) control 344. Address control 344 provides a signal or a control for select 334 when the address of request 314 should be selected for capture. In one example, address control 344 can cause select 334 to select every address for every request, which will trigger the memory device to overwrite the DRFM aggressor address on every new request 314. In one example, address control 344 randomizes the control of select 334. Address control 344 can receive Activate count 328 from Activate monitor 326 and randomly trigger select 334 based on the count. Thus, select 334 can randomly indicate the address to the memory device for capture.

Address (ADDR) capture 384 represents an address capture indication when select 334 selects an address for capture. In one example, address capture 384 triggers an activate command in scheduler 382 to have a flag set or a field populated to indicate address capture to the memory device. Thus, when the memory device receives and decodes the command, it can identify the address capture trigger and store the address for a subsequent DRFM mitigation operation.

System 304 includes select 354, which represents a selection circuit to determine when to select request 314 as a trigger for a DRFM command. DRFM control 364 represents control to cause select 354 to generate the DRFM command. Send DRFM 386 represents the DRFM command or a control signal to trigger generation of the DRFM command. System 304 can cause provide the DRFM command to scheduler 382 to schedule to send to the memory device.

DRFM control 364 can randomize the generation of the DRFM command based on counter 390. Counter 390 can represent a counter or a timer in system 304 to generate a count. With the count from counter 390 as an input, DRFM control 364 can pseudorandomly trigger select 354. The combination of counter 390 and DRFM control 364 can provide a pseudorandom timer to randomize the timing and the frequency of generation of the DRFM command. Randomization of select 354 will mean the exact timing of DRFM command should be unknowable to an attacker attempting a row hammer attack.

Scheduler 382 can represent the scheduler of the memory controller. Scheduler 382 will schedule access commands to send to the memory device. The access commands are not explicitly shown in system 304. Request 314 will have an access command or commands associated with it. Such commands can include an activate command, which can be configured to trigger address capture based on select 334. Address capture 384 can represent a command to be scheduled by scheduler 382, or the setting of a field in an access command to indicate address capture. Send DRFM 386 represents that scheduler 382 will have a DRFM command to schedule to send to the memory device.

In one example, address control 344 represents a linear feedback shift register (LFSR) with high insertion rate. The high insertion rate can be on the order of single digits or double digits of commands. Thus, on average, every so many Activates as indicated by Activate count 328, address control 344 can generate a signal to cause select 334 to select the address of request 314 for capture. In one example, in place of an LFSR seeded based on Activate count 328, address control 344 can be implemented as a pseudorandom timer, receiving a counter input similar to counter 390, but making a selection with a higher frequency than DRFM control 364.

In one example, DRFM control 364 represents an LFSR with a lower insertion rate. The lower insertion rate can be an order of magnitude or two orders of magnitude less frequent than the insertion rate of address control 344. The lower insertion rate can be on the order of 1 out of every 200 or 1 out of every 500 requests. The lower insertion rate can be less frequent than 1 out of 500. In general, the lower insertion rate triggers DRFM commands with less frequency than the higher insertion rate triggers address capture indications or address capture commands.

In one example, address control 344 triggers select 334 on every request 314. Thus, scheduler 382 can indicate address capture to the memory device for every activate command. Therefore, system 304 can have a configuration as control circuitry that randomizes the generation of an address capture command and randomizes the generation of the DRFM command. Alternatively, system 304 can have a configuration as control circuitry that randomizes the generation of the DRFM command and generates an address capture command in a non-randomized manner, which can be every command or every other command, every third command, or so forth.

In one example, the insertion rate of address control 344 is configurable or programmable by the platform basic input/output system (BIOS). The BIOS can configure the insertion rate whether implemented as a selection based on Activate count or based on a timer or counter. In one example, the BIOS can configure or program the insertion rate of DRFM control 364. The BIOS can configure the insertion rate whether implemented as a selection based on Activate count or based on a timer or counter.

Figure 4:
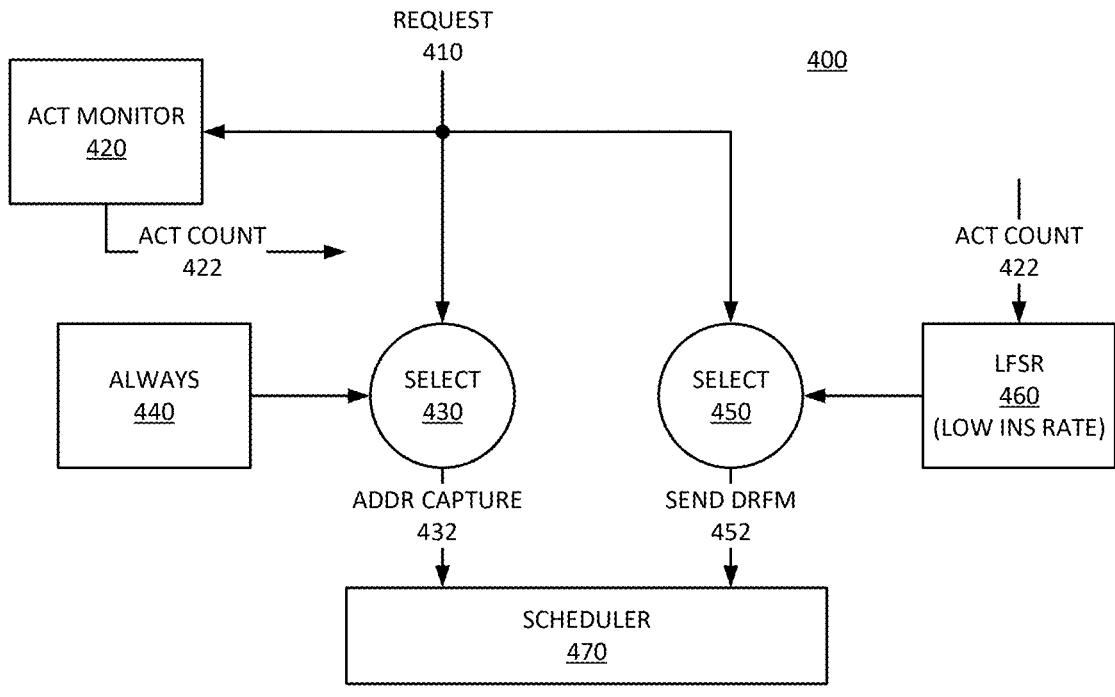
FIG. 4 is a block diagram of an example of a circuit to provide constant address capture and randomized DRFM selection based on Activate monitoring.

FIG. 4 is a block diagram of an example of a circuit to provide constant address capture and randomized DRFM selection based on Activate monitoring. System 400 represents components of a memory controller, such as memory controller 120 of system 100 or memory controller 220 of system 200. System 400 represents a system in accordance with an example of system 302 or an example of system 304.

System 400 includes select 430 controlled by always 440. Thus, in response to every request 410, select 430 selects the address for the request, and system 400 generates address (ADDR) capture 432 for scheduler 470. Scheduler 470 schedules a command indication to send to the memory device to indicate the memory device to capture the address for a subsequent DRFM command.

System 400 includes select 450 controlled by LFSR 460, which is a low insertion (INS) rate LFSR. The low rate is relative to the higher rate of "always" to control select 430. In one example, LFSR 460 generates an output signal to select 450 based on a timer. In one example, LFSR 460 generates an output signal to select 450 based on Activate (ACT) count 422. System 400 can include Activate (ACT) monitor 420 to generate Activate count 422 based on a number of activate commands to a bank, based on sequences of requests.

In system 400, the memory controller or host controller can mark all activated addresses to be captured by the memory device via an indication in precharge commands. LFSR 460 enables the host controller to select an activate command pseudorandomly with select 450 to trigger send DRFM 452, which generates a DRFM command. The DRFM command is expected to be provided after the memory device has an address captured for the multiple banks that will be the subject of the DRFM command. As such, most or all of the banks affected by the DRFM command will have an address to use for row hammer mitigation.

Scheduler 470 will schedule and send the DRFM command, triggering the memory device to perform a refresh mitigation operation based on the most recently captured address as the aggressor. Thus, the addresses used by the memory device for the different banks will be real addresses that were recently activated.

With the DRFM randomization of system 400, all banks receiving a DRFM command will have an address captured, unless there have been no activates to a bank since the previous DRFM command was sent. While the logic of system 400 is simple, the lack of randomization of the address capture can allow an attacker to predict when a consecutive group of addresses is mitigated for a bank. Even without knowing which consecutive group of addresses is mitigated, there is some predictability in the approach.

Figure 5:
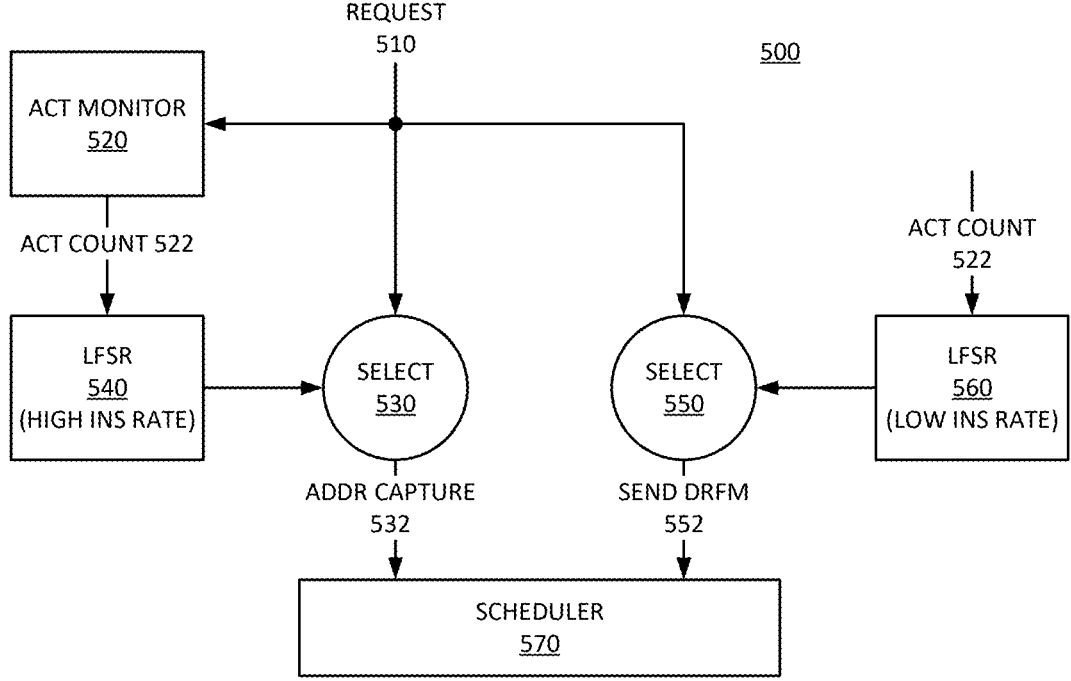
FIG. 5 is a block diagram of an example of a circuit to provide randomized address capture and randomized DRFM selection based on Activate monitoring.

FIG. 5 is a block diagram of an example of a circuit to provide randomized address capture and randomized DRFM selection based on Activate monitoring. System 500 represents components of a memory controller, such as memory controller 120 of system 100 or memory controller 220 of system 200. System 500 represents a system in accordance with an example of system 302 or an example of system 304.

System 500 includes select 530 controlled by LFSR 540, which represents a high insertion (INS) rate LFSR. In response to request 510, select 530 selects the address for the request based on an indication from LFSR 540. In one example, LFSR 540 generates an output to trigger select 530 based on Activate (ACT) count 522. When select 530 selects the address system 500 generates address (ADDR) capture 532 for scheduler 570. Scheduler 570 schedules a command indication to send to the memory device to indicate the memory device to capture the address for a subsequent DRFM command.

System 500 includes select 550 controlled by LFSR 560, which is a low insertion (INS) rate LFSR. The low rate is relative to the high insertion rate of LFSR 540 that controls select 530. In one example, LFSR 560 generates an output signal to select 550 based on a timer. In one example, LFSR 560 generates an output signal to select 550 based on Activate (ACT) count 522. System 500 can include Activate (ACT) monitor 520 to generate Activate count 522 based on occurrence of activate commands to a bank, based on sequences of requests.

In one example, instead of having two separate LFSRs, system can have an LFSR with different outputs. Thus, a single LFSR could provide a high insertion rate output and a lower insertion rate output, replacing LFSR 540 and LFSR 560 with such a double-output LFSR.

System 500 has two components of randomness, by randomizing the address capture and randomizing sending of the DRFM command. In system 500, the memory controller or host controller selects addresses in different banks in a way that is not consecutive selection of addresses, which randomizes address selection between the banks. LFSR 560 enables the host controller to select an activate command pseudorandomly with select 550 to trigger send DRFM 552, which generates a DRFM command. The DRFM command is expected to be provided after the memory device has an address captured for the multiple banks that will be the subject of the DRFM command. As such, most or all of the banks affected by the DRFM command will have an address to use for row hammer mitigation.

Scheduler 570 will schedule and send the DRFM command, triggering the memory device to perform a refresh mitigation operation based on the most recently captured address as the aggressor. Thus, the addresses used by the memory device for the different banks will be real addresses that were recently activated.

With the DRFM randomization of system 500, every bank receiving a DRFM command is expected to have an address captured almost every time a DRFM command is sent. In system 500, there is a greater chance a bank will not have an address captured for the DRFM command as compared to system 400, because LFSR 540 may not have picked an address for one or more of the banks by the time the DRFM command is sent. The risk of a bank not having a captured address increases the closer the high insertion rate and lower insertion rate are in value. For example, if the high insertion rate is 5 or 8 instead of a lower number like 2 or 3, and the lower insertion rate is approximately 200 instead of a lower frequency like 500, the risk increases that a bank address has not been captured.

Figures 6, 7:
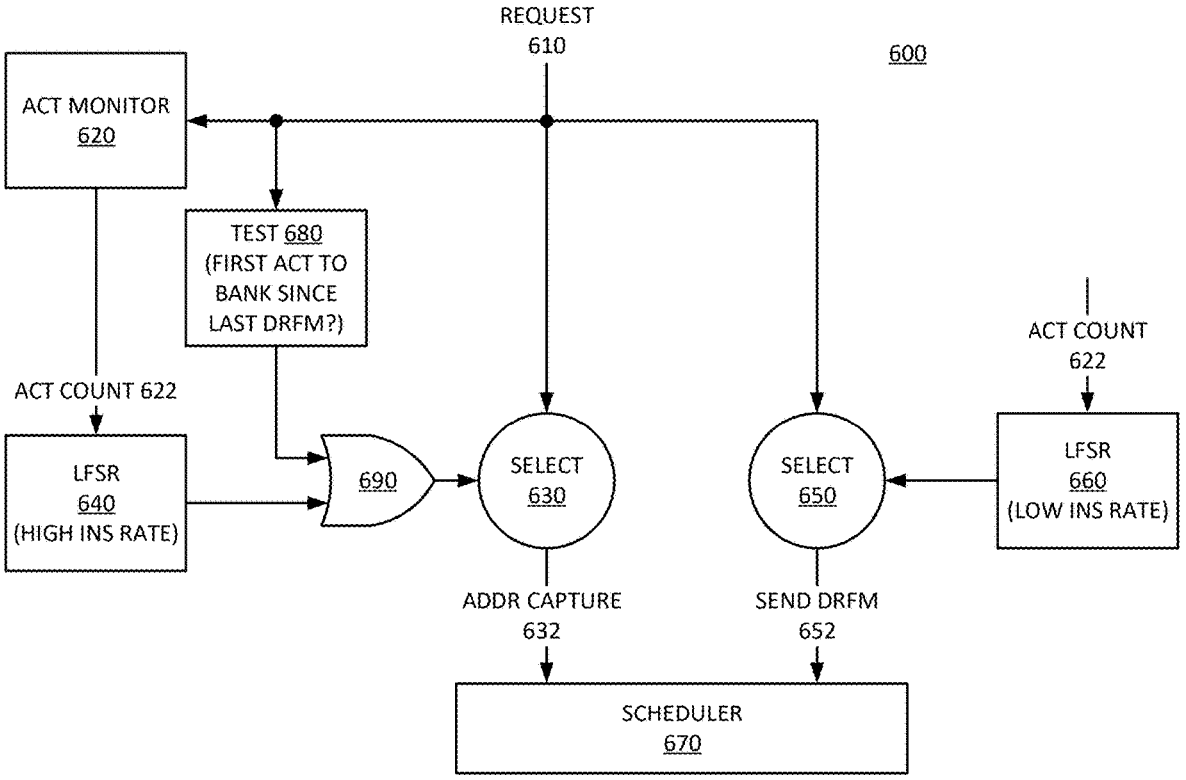
FIG. 6 is a block diagram of an example of a circuit to provide randomized address capture after first address capture, and randomized DRFM selection based on Activate monitoring.
FIG. 7 is a block diagram of an example of a command to indicate address capture.

FIG. 6 is a block diagram of an example of a circuit to provide randomized address capture after first address capture, and randomized DRFM selection based on Activate monitoring. System 600 represents components of a memory controller, such as memory controller 120 of system 100 or memory controller 220 of system 200. System 600 represents a system in accordance with an example of system 302 or an example of system 304.

System 600 includes select 630 controlled by LFSR 640, which represents a high insertion (INS) rate LFSR, and test 680, which is a test to determine if request 610 triggers the first Activate (ACT) to the bank since the last DRFM command. In response to request 610, select 630 selects the address for the request based on an indication from LFSR 640 or positive answer to test 680. Logic 690 represents an OR logic gate to select either the output of LFSR 640 or the output of test 680.

It will be understood that test 680 will be true once per bank per period between DRFM command. The remainder of the time, LFSR 640 will control select 630. In one example, LFSR 640 generates an output to trigger select 630 based on Activate (ACT) count 622. When select 630 selects the address system 600 generates address (ADDR) capture 632 for scheduler 670. Scheduler 670 schedules a command indication to send to the memory device to indicate the memory device to capture the address for a subsequent DRFM command.

System 600 includes select 650 controlled by LFSR 660, which is a low insertion (INS) rate LFSR. The low rate is relative to the high insertion rate of LFSR 640 that controls select 630. In one example, LFSR 660 generates an output signal to select 650 based on a timer. In one example, LFSR 660 generates an output signal to select 650 based on Activate (ACT) count 622. System 600 can include Activate (ACT) monitor 620 to generate Activate count 622 based on occurrence of activate commands to a bank, based on sequences of requests.

In one example, instead of having two separate LFSRs, system can have an LFSR with different outputs. Thus, a single LFSR could provide a high insertion rate output and a lower insertion rate output, replacing LFSR 640 and LFSR 660 with such a double-output LFSR.

System 600 has two components of randomness, by randomizing the address capture and randomizing sending of the DRFM command. In system 600, the memory controller or host controller selects addresses in different banks in a way that is not consecutive selection of addresses, which randomizes address selection between the banks. LFSR 660 enables the host controller to select an activate command pseudorandomly with select 650 to trigger send DRFM 652, which generates a DRFM command. The DRFM command is expected to be provided after the memory device has an address captured for the multiple banks that will be the subject of the DRFM command. As such, most or all of the banks affected by the DRFM command will have an address to use for row hammer mitigation.

Scheduler 670 will schedule and send the DRFM command, triggering the memory device to perform a refresh mitigation operation based on the most recently captured address as the aggressor. Thus, the addresses used by the memory device for the different banks will be real addresses that were recently activated.

With the DRFM randomization of system 600, every bank receiving a DRFM command is expected to have an address captured almost every time a DRFM command is sent. In system 600, the inclusion of test 680 increases the chance a bank will have an address captured for the DRFM command as compared to system 500, and in theory would have the same frequency of having all banks with an address as system 400. The inclusion of test 680 can reduce the risk of a bank not having a captured address, even if the high insertion rate and lower insertion rate are relatively close in value.

While system 600 increases the chance every bank will have an address captured, system 600 includes more logic than system 400 or system 500. In one example, test 680 includes a "scorecard" for each bank. The scorecard refers to a bit or a value stored for each bank to indicate whether an Activate has been sent to the bank. Test 680 will perform a comparison on each request 610 against the scorecard to determine whether the test is true. In one example, test 680 is selectively enabled and disabled. For example, test 680 can be enabled for only N clocks after a DRFM command has been issued. In another example, test 680 is enabled for M total Activates to the banks. Whether based on a clock or based on the total number of Activates received, disabling test 680 can reduce the power usage of the circuitry.

FIG. 7 is a block diagram of an example of a command to indicate address capture. Command 700 represents a precharge command or other command that a system can use to trigger a memory device to capture an address to subsequent DRFM mitigation.

Encoding 710 represents the command encoding, such as a precharge command, RDA command, WRA command, or other command. It will be understood that precharge is a good candidate to trigger address capture because memory access is typically accompanied by a precharge command, and the precharge command includes address information. It will be understood that other commands, including custom commands, can be used to indicate an address for capture. Address 720 represents the address information for command 700.

Capture 730 represents a field, such as a bit or a group of bits, in the command to indicate the memory device should capture address 720. When capture 730 is set true or otherwise indicates capture, the memory device stores the row address indicated in address 720 to use on the next DRFM that affects the bank to which command 700 is directed.

Figure 8:
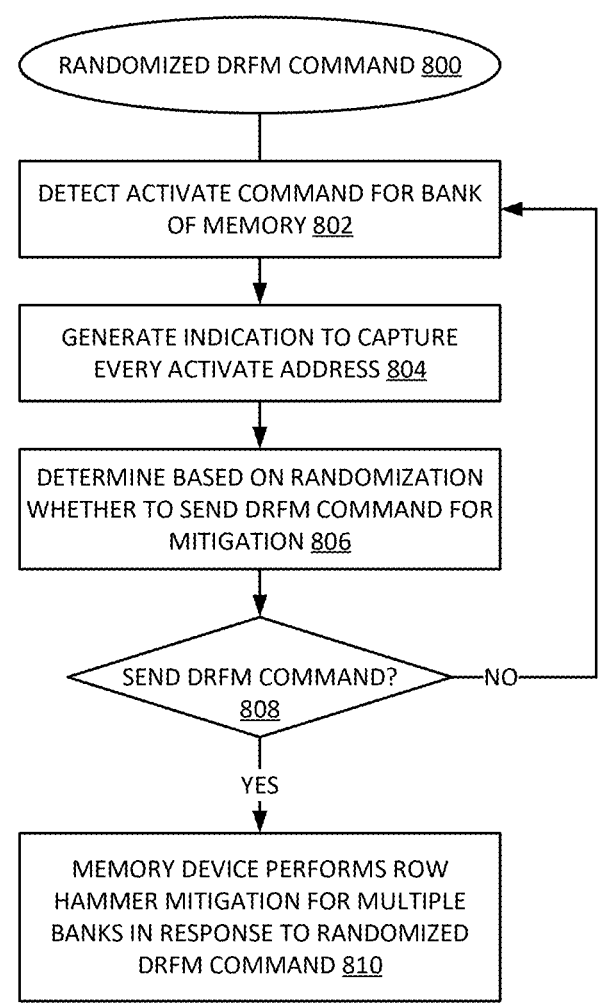
FIG. 8 is a flow diagram of an example of a process for constant address capture and randomized DRFM selection based on Activate monitoring.

FIG. 8 is a flow diagram of an example of a process for constant address capture and randomized DRFM selection based on Activate monitoring. Process 800 represents a process for randomizing the generation of a DRFM command for a system in accordance with an example of system 100 or system 200.

A control circuit of the memory controller detects an activate command for a bank of a memory, at 802. In one example, the control circuit generates an indication to capture every activate address, at 804. The memory controller can send an indication to the memory to capture the address for use with a subsequent DRFM command.

The control circuit can determine in a randomized manner whether to send a DRFM command for mitigation, at 806. The randomization means that the frequency of sending DRFM commands varies, and thus, not every activate command will result in the sending of a DRFM command (e.g., DRFMab, DRFMsb). If the control circuit determines not to send the DRFM command, at 808 NO branch, the control circuit continues to monitor activate commands, at 802.

If the control circuit determines to send a DRFM command, at 808 YES branch, the command can trigger a memory device to perform row hammer mitigation for multiple banks in response to the randomized DRFM command, at 810. The addresses used for the various banks will be the address captured in response to the control circuit generating the indication to capture every activate address, at 804. Capturing every address provides a very high likelihood every bank affected by the DRFM command will have an address to use as the basis for target row refresh for row hammer mitigation.

Figure 9:
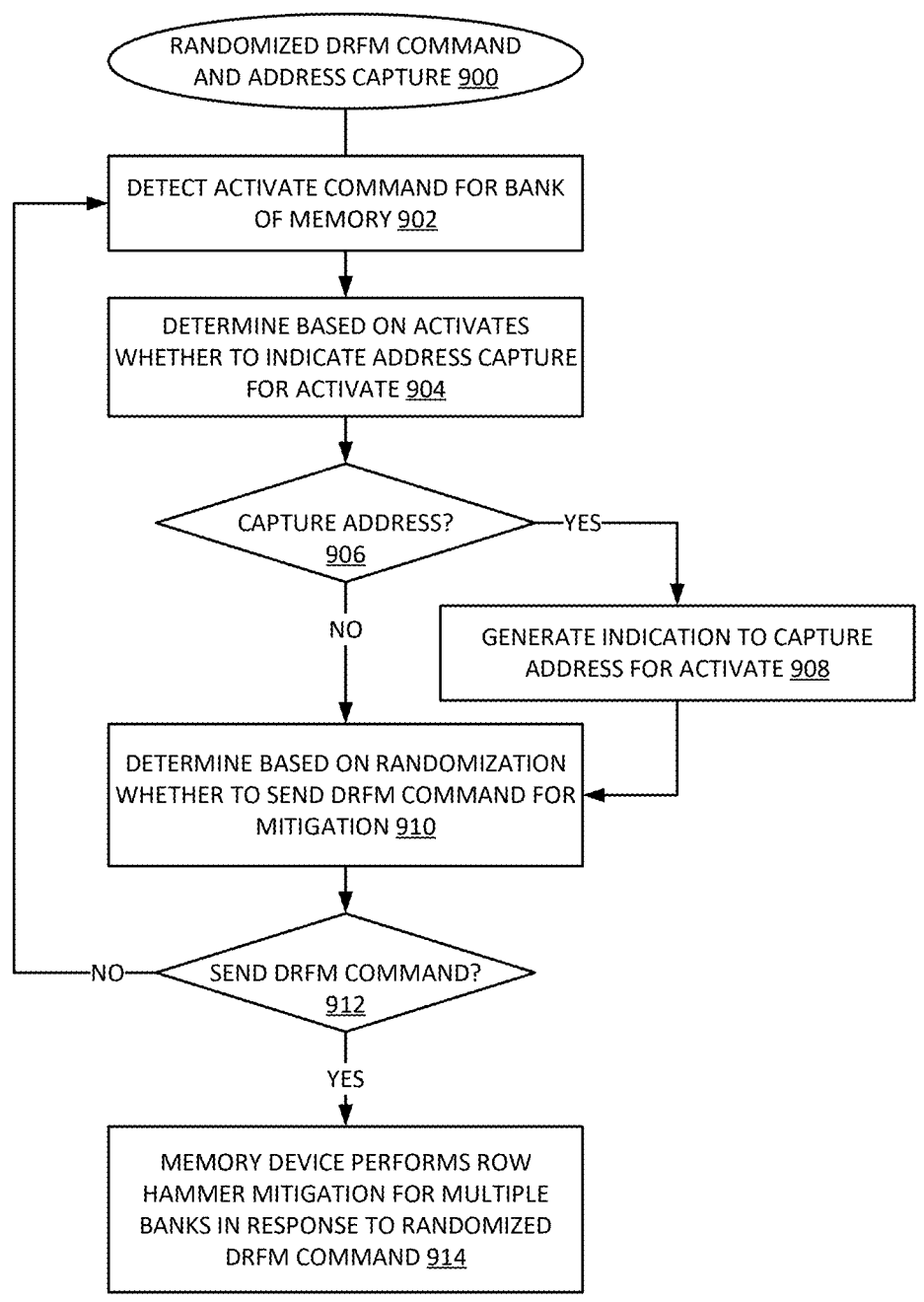
FIG. 9 is a flow diagram of an example of a process for randomized address capture and randomized DRFM selection based on Activate monitoring.

FIG. 9 is a flow diagram of an example of a process for randomized address capture and randomized DRFM selection based on Activate monitoring. Process 900 represents a process for randomizing the generation of a DRFM command and randomizing the capture of addresses for use with the DRFM command for a system in accordance with an example of system 100 or system 200.

A control circuit of the memory controller detects an activate command for a bank of a memory, at 902. In one example, the control circuit determines based on activate commands received whether to indicate an address capture for the activate detected, at 904. The memory controller can send an indication to the memory to capture the address for use with a subsequent DRFM command.

If the control circuit determines to trigger the memory device to capture the address, at 906 YES branch, the control circuit can generate an indication to send to the memory device to capture the address for the activate command detected, at 908. After generating the capture indication, at 908, or if the control circuit determines not to trigger the memory device to capture the address, at 906 NO branch, the control circuit can determine in a randomized manner whether to send a DRFM command for mitigation, at 910. The randomization means that the frequency of sending DRFM commands varies, and thus, not every activate command will result in the sending of a DRFM command (e.g., DRFMab, DRFMsb). If the control circuit determines not to send the DRFM command, at 912 NO branch, the control circuit continues to monitor activate commands, at 902.

If the control circuit determines to send a DRFM command, at 912 YES branch, the command can trigger a memory device to perform row hammer mitigation for multiple banks in response to the randomized DRFM command, at 914. The addresses used for the various banks will be the address captured in response to the control circuit generating the indication to capture activate addresses, at 908.

Figure 10:
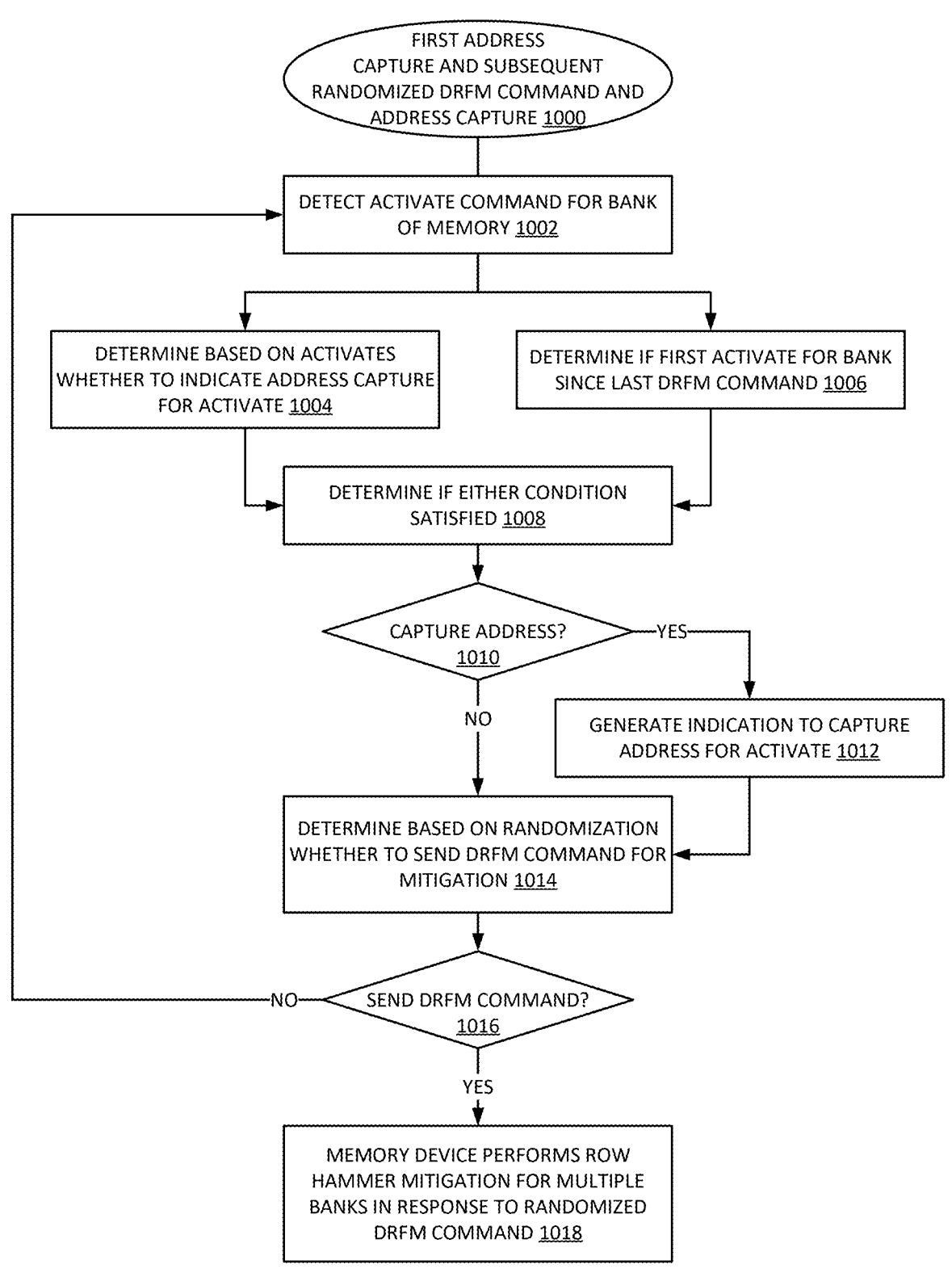
FIG. 10 is a flow diagram of an example of a process for randomized address capture after first address capture, and randomized DRFM selection based on Activate monitoring.

FIG. 10 is a flow diagram of an example of a process for randomized address capture after first address capture, and randomized DRFM selection based on Activate monitoring. Process 1000 represents a process for randomizing the generation of a DRFM command and randomizing the capture of addresses for use with the DRFM command for a system in accordance with an example of system 100 or system 200.

A control circuit of the memory controller detects an activate command for a bank of a memory, at 1002. In one example, the control circuit determines based on activate commands received whether to indicate an address capture for the activate detected, at 1004. In one example, the control circuit also determines if the activate detected is the first activate for a bank since the last DRFM command was issued, at 1006.

The control circuit can determine whether either condition is satisfied, at 1008. If the control circuit determines to trigger the memory device to capture the address, at 1010 YES branch, the control circuit can generate an indication to send to the memory device to capture the address for the activate command detected, at 1012. After generating the capture indication, at 1012, or if the control circuit determines not to trigger the memory device to capture the address, at 1010 NO branch, the control circuit can determine in a randomized manner whether to send a DRFM command for mitigation, at 1014. The randomization means that the frequency of sending DRFM commands varies, and thus, not every activate command will result in the sending of a DRFM command (e.g., DRFMab, DRFMsb). If the control circuit determines not to send the DRFM command, at 1016 NO branch, the control circuit continues to monitor activate commands, at 1002.

If the control circuit determines to send a DRFM command, at 1016 YES branch, the command can trigger a memory device to perform row hammer mitigation for multiple banks in response to the randomized DRFM command, at 1018. The addresses used for the various banks will be the address captured in response to the control circuit generating the indication to capture activate addresses, at 1012.

Figure 11:
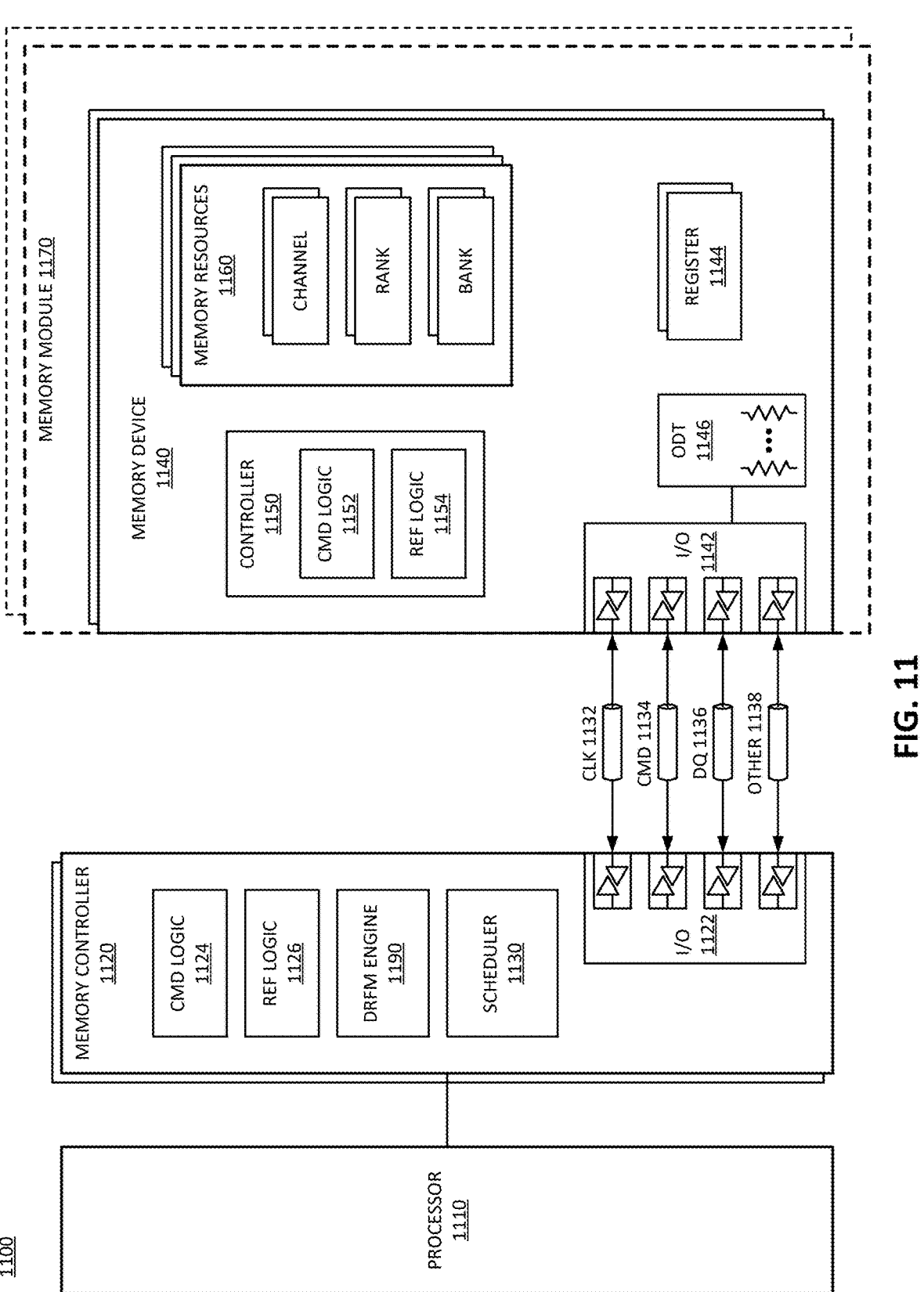
FIG. 11 is a block diagram of an example of a memory subsystem in which randomized DRFM selection can be implemented.

FIG. 11 is a block diagram of an example of a memory subsystem in which randomized DRFM selection can be implemented. System 1100 includes a processor and elements of a memory subsystem in a computing device. System 1100 represents a system in accordance with an example of system 100 or system 200.

In one example, memory controller 1120 includes DRFM engine 1190. DRFM engine 1190 enables memory controller 1120 to randomize selection of an activate address to issue a DRFM command for memory device 1140 to perform row hammer mitigation. The DRFM command applies to multiple banks of memory device 1140. Memory device 1140 will perform the row hammer mitigation for each bank based on an address captured for the bank. In one example, memory controller 1120 also randomizes the capturing of the address with DRFM engine 1190 for the banks for use with the DRFM command.

Processor 1110 represents a processing unit of a computing platform that may execute an operating system (OS) and applications, which can collectively be referred to as the host or the user of the memory. The OS and applications execute operations that result in memory accesses. Processor 1110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 1100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

Memory controller 1120 represents one or more memory controller circuits or devices for system 1100. Memory controller 1120 represents control logic that generates memory access commands in response to the execution of operations by processor 1110. Memory controller 1120 accesses one or more memory devices 1140. Memory devices 1140 can be DRAM devices in accordance with any referred to above. In one example, memory devices 1140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1120 manages a separate memory channel, although system 1100 can be configured to have multiple channels managed by a single controller, or to have multiple controllers on a single channel. In one example, memory controller 1120 is part of host processor 1110, such as logic implemented on the same die or implemented in the same package space as the processor.

Memory controller 1120 includes I/O interface logic 1122 to couple to a memory bus, such as a memory channel as referred to above. I/O interface logic 1122 (as well as I/O interface logic 1142 of memory device 1140) can include pins, pads, connectors, signal lines, traces, or wires, or other hardware to connect the devices, or a combination of these. I/O interface logic 1122 can include a hardware interface. As illustrated, I/O interface logic 1122 includes at least drivers/ transceivers for signal lines. Commonly, wires within an integrated circuit interface couple with a pad, pin, or connector to interface signal lines or traces or other wires between devices. I/O interface logic 1122 can include drivers, receivers, transceivers, or termination, or other circuitry or combinations of circuitry to exchange signals on the signal lines between the devices. The exchange of signals includes at least one of transmit or receive. While shown as coupling I/O 1122 from memory controller 1120 to I/O 1142 of memory device 1140, it will be understood that in an implementation of system 1100 where groups of memory devices 1140 are accessed in parallel, multiple memory devices can include I/O interfaces to the same interface of memory controller 1120. In an implementation of system 1100 including one or more memory modules 1170, I/O 1142 can include interface hardware of the memory module in addition to interface hardware on the memory device itself. Other memory controllers 1120 will include separate interfaces to other memory devices 1140.

The bus between memory controller 1120 and memory devices 1140 can be implemented as multiple signal lines coupling memory controller 1120 to memory devices 1140. The bus may typically include at least clock (CLK) 1132, command/address (CMD) 1134, and write data (DQ) and read data (DQ) 1136, and zero or more other signal lines 1138. In one example, a bus or connection between memory controller 1120 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1120 and memory devices 1140. An example of a serial bus technology is 8B10B encoding and transmission of high-speed data with embedded clock over a single differential pair of signals in each direction. In one example, CMD 1134 represents signal lines shared in parallel with multiple memory devices. In one example, multiple memory devices share encoding command signal lines of CMD 1134, and each has a separate chip select (CS_n) signal line to select individual memory devices.

It will be understood that in the example of system 1100, the bus between memory controller 1120 and memory devices 1140 includes a subsidiary command bus CMD 1134 and a subsidiary bus to carry the write and read data, DQ 1136. In one example, the data bus can include bidirectional lines for read data and for write/command data. In another example, the subsidiary bus DQ 1136 can include unidirectional write signal lines for write and data from the host to memory, and can include unidirectional lines for read data from the memory to the host. In accordance with the chosen memory technology and system design, other signals 1138 may accompany a bus or sub bus, such as strobe lines DQS. Based on design of system 1100, or implementation if a design supports multiple implementations, the data bus can have more or less bandwidth per memory device 1140. For example, the data bus can support memory devices that have either a x4 interface, a x8 interface, a x16 interface, or other interface. The convention "xW," where W is an integer that refers to an interface size or width of the interface of memory device 1140, which represents a number of signal lines to exchange data with memory controller 1120. The interface size of the memory devices is a controlling factor on how many memory devices can be used concurrently per channel in system 1100 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1140 and memory controller 1120 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 1140 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 1140 represent memory resources for system 1100. In one example, each memory device 1140 is a separate memory die. In one example, each memory device 1140 can interface with multiple (e.g., 2) channels per device or die. Each memory device 1140 includes I/O interface logic 1142, which has a bandwidth determined by the implementation of the device (e.g., x16 or x8 or some other interface bandwidth). I/O interface logic 1142 enables the memory devices to interface with memory controller 1120. I/O interface logic 1142 can include a hardware interface, and can be in accordance with I/O 1122 of memory controller, but at the memory device end. In one example, multiple memory devices 1140 are connected in parallel to the same command and data buses. In another example, multiple memory devices 1140 are connected in parallel to the same command bus, and are connected to different data buses. For example, system 1100 can be configured with multiple memory devices 1140 coupled in parallel, with each memory device responding to a command, and accessing memory resources 1160 internal to each. For a Write operation, an individual memory device 1140 can write a portion of the overall data word, and for a Read operation, an individual memory device 1140 can fetch a portion of the overall data word. The remaining bits of the word will be provided or received by other memory devices in parallel.

In one example, memory devices 1140 are disposed directly on a motherboard or host system platform (e.g., a PCB (printed circuit board) on which processor 1110 is disposed) of a computing device. In one example, memory devices 1140 can be organized into memory modules 1170. In one example, memory modules 1170 represent dual inline memory modules (DIMMs). In one example, memory modules 1170 represent other organization of multiple memory devices to share at least a portion of access or control circuitry, which can be a separate circuit, a separate device, or a separate board from the host system platform. Memory modules 1170 can include multiple memory devices 1140, and the memory modules can include support for multiple separate channels to the included memory devices disposed on them. In another example, memory devices 1140 may be incorporated into the same package as memory controller 1120, such as by techniques such as multi-chip-module (MCM), package-on-package, through-silicon via (TSV), or other techniques or combinations. Similarly, in one example, multiple memory devices 1140 may be incorporated into memory modules 1170, which themselves may be incorporated into the same package as memory controller 1120. It will be appreciated that for these and other implementations, memory controller 1120 may be part of host processor 1110.

Memory devices 1140 each include one or more memory arrays 1160. Memory array 1160 represents addressable memory locations or storage locations for data. Typically, memory array 1160 is managed as rows of data, accessed via wordline (rows) and bitline (individual bits within a row) control. Memory array 1160 can be organized as separate channels, ranks, and banks of memory. Channels may refer to independent control paths to storage locations within memory devices 1140. Ranks may refer to common locations across multiple memory devices (e.g., same row addresses within different devices) in parallel. Banks may refer to sub-arrays of memory locations within a memory device 1140. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1140 include one or more registers 1144. Register 1144 represents one or more storage devices or storage locations that provide configuration or settings for the operation of the memory device. In one example, register 1144 can provide a storage location for memory device 1140 to store data for access by memory controller 1120 as part of a control or management operation. In one example, register 1144 includes one or more Mode Registers. In one example, register 1144 includes one or more multipurpose registers. The configuration of locations within register 1144 can configure memory device 1140 to operate in different "modes," where command information can trigger different operations within memory device 1140 based on the mode. Additionally or in the alternative, different modes can also trigger different operation from address information or other signal lines depending on the mode. Settings of register 1144 can indicate configuration for I/O settings (e.g., timing, termination or ODT (on-die termination) 1146, driver configuration, or other I/O settings).

In one example, memory device 1140 includes ODT 1146 as part of the interface hardware associated with I/O 1142. ODT 1146 can be configured as mentioned above, and provide settings for impedance to be applied to the interface to specified signal lines. In one example, ODT 1146 is applied to DQ signal lines. In one example, ODT 1146 is applied to command signal lines. In one example, ODT 1146 is applied to address signal lines. In one example, ODT 1146 can be applied to any combination of the preceding. The ODT settings can be changed based on whether a memory device is a selected target of an access operation or a non-target device. ODT 1146 settings can affect the timing and reflections of signaling on the terminated lines. Careful control over ODT 1146 can enable higher-speed operation with improved matching of applied impedance and loading. ODT 1146 can be applied to specific signal lines of I/O interface 1142, 1122 (for example, ODT for DQ lines or ODT for CA lines), and is not necessarily applied to all signal lines.

Memory device 1140 includes controller 1150, which represents control logic within the memory device to control internal operations within the memory device. For example, controller 1150 decodes commands sent by memory controller 1120 and generates internal operations to execute or satisfy the commands. Controller 1150 can be referred to as an internal controller, and is separate from memory controller 1120 of the host. Controller 1150 can determine what mode is selected based on register 1144, and configure the internal execution of operations for access to memory resources 1160 or other operations based on the selected mode. Controller 1150 generates control signals to control the routing of bits within memory device 1140 to provide a proper interface for the selected mode and direct a command to the proper memory locations or addresses. Controller 1150 includes command logic 1152, which can decode command encoding received on command and address signal lines. Thus, command logic 1152 can be or include a command decoder. With command logic 1152, memory device can identify commands and generate internal operations to execute requested commands.

Referring again to memory controller 1120, memory controller 1120 includes command (CMD) logic 1124, which represents logic or circuitry to generate commands to send to memory devices 1140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 1140, memory controller 1120 can issue commands via I/O 1122 to cause memory device 1140 to execute the commands. In one example, controller 1150 of memory device 1140 receives and decodes command and address information received via I/O 1142 from memory controller 1120. Based on the received command and address information, controller 1150 can control the timing of operations of the logic and circuitry within memory device 1140 to execute the commands. Controller 1150 is responsible for compliance with standards or specifications within memory device 1140, such as timing and signaling requirements. Memory controller 1120 can implement compliance with standards or specifications by access scheduling and control.

Memory controller 1120 includes scheduler 1130, which represents logic or circuitry to generate and order transactions to send to memory device 1140. From one perspective, the primary function of memory controller 1120 could be said to schedule memory access and other transactions to memory device 1140. Such scheduling can include generating the transactions themselves to implement the requests for data by processor 1110 and to maintain integrity of the data (e.g., such as with commands related to refresh).

Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1120 typically includes logic such as scheduler 1130 to allow selection and ordering of transactions to improve performance of system 1100. Thus, memory controller 1120 can select which of the outstanding transactions should be sent to memory device 1140 in which order, which is typically achieved with logic much more complex that a simple first-in first-out algorithm. Memory controller 1120 manages the transmission of the transactions to memory device 1140, and manages the timing associated with the transaction. In one example, transactions have deterministic timing, which can be managed by memory controller 1120 and used in determining how to schedule the transactions with scheduler 1130.

In one example, memory controller 1120 includes refresh (REF) logic 1126. Refresh logic 1126 can be used for memory resources that are volatile and need to be refreshed to retain a deterministic state. In one example, refresh logic 1126 indicates a location for refresh, and a type of refresh to perform. Refresh logic 1126 can trigger self-refresh within memory device 1140, or execute external refreshes which can be referred to as auto refresh commands) by sending refresh commands, or a combination. In one example, controller 1150 within memory device 1140 includes refresh logic 1154 to apply refresh within memory device 1140. In one example, refresh logic 1154 generates internal operations to perform refresh in accordance with an external refresh received from memory controller 1120. Refresh logic 1154 can determine if a refresh is directed to memory device 1140, and what memory resources 1160 to refresh in response to the command.

Figure 12:
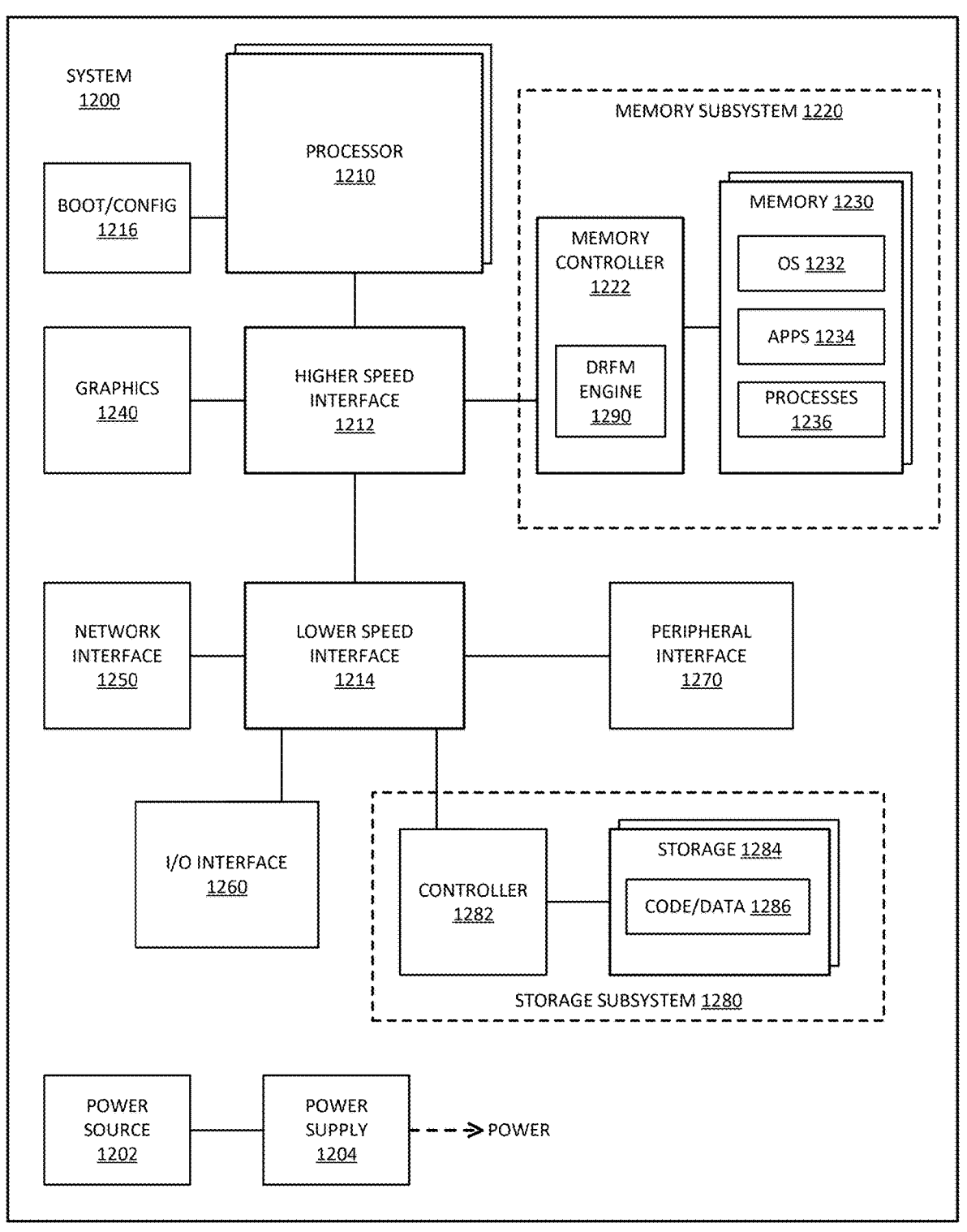
FIG. 12 is a block diagram of an example of a computing system in which randomized DRFM selection can be implemented.

FIG. 12 is a block diagram of an example of a computing system in which randomized DRFM selection can be implemented. System 1200 represents a computing device in accordance with any example herein, and can be a laptop computer, a desktop computer, a tablet computer, a server, a gaming or entertainment control system, embedded computing device, or other electronic device.

System 1200 represents a system in accordance with an example of system 100 or system 200. In one example, memory controller 1222 includes DRFM engine 1290. DRFM engine 1290 enables memory controller 1222 to randomize selection of an activate address to issue a DRFM command for memory 1230 to perform row hammer mitigation. The DRFM command applies to multiple banks of memory 1230. Memory 1230 will perform the row hammer mitigation for each bank based on an address captured for the bank. In one example, memory controller 1222 also randomizes the capturing of the address for the banks with DRFM engine 1290 for use with the DRFM command.

System 1200 includes processor 1210 can include any type of microprocessor, central processing unit (CPU), graphics processing unit (GPU), processing core, or other processing hardware, or a combination, to provide processing or execution of instructions for system 1200. Processor 1210 can be a host processor device. Processor 1210 controls the overall operation of system 1200, and can be or include, one or more programmable general-purpose or special-purpose microprocessors, digital signal processors (DSPs), programmable controllers, application specific integrated circuits (ASICs), programmable logic devices (PLDs), or a combination of such devices.

System 1200 includes boot/config 1216, which represents storage to store boot code (e.g., basic input/output system (BIOS)), configuration settings, security hardware (e.g., trusted platform module (TPM)), or other system level hardware that operates outside of a host OS. Boot/config 1216 can include a nonvolatile storage device, such as read-only memory (ROM), flash memory, or other memory devices.

In one example, system 1200 includes interface 1212 coupled to processor 1210, which can represent a higher speed interface or a high throughput interface for system components that need higher bandwidth connections, such as memory subsystem 1220 or graphics interface components 1240. Interface 1212 represents an interface circuit, which can be a standalone component or integrated onto a processor die. Interface 1212 can be integrated as a circuit onto the processor die or integrated as a component on a system on a chip. Where present, graphics interface 1240 interfaces to graphics components for providing a visual display to a user of system 1200. Graphics interface 1240 can be a standalone component or integrated onto the processor die or system on a chip. In one example, graphics interface 1240 can drive a high definition (HD) display or ultra high definition (UHD) display that provides an output to a user. In one example, the display can include a touch-screen display. In one example, graphics interface 1240 generates a display based on data stored in memory 1230 or based on operations executed by processor 1210 or both.

Memory subsystem 1220 represents the main memory of system 1200, and provides storage for code to be executed by processor 1210, or data values to be used in executing a routine. Memory subsystem 1220 can include one or more varieties of random-access memory (RAM) such as DRAM, 3DXP (three-dimensional crosspoint), or other memory devices, or a combination of such devices. Memory 1230 stores and hosts, among other things, operating system (OS) 1232 to provide a software platform for execution of instructions in system 1200. Additionally, applications 1234 can execute on the software platform of OS 1232 from memory 1230. Applications 1234 represent programs that have their own operational logic to perform execution of one or more functions. Processes 1236 represent agents or routines that provide auxiliary functions to OS 1232 or one or more applications 1234 or a combination. OS 1232, applications 1234, and processes 1236 provide software logic to provide functions for system 1200. In one example, memory subsystem 1220 includes memory controller 1222, which is a memory controller to generate and issue commands to memory 1230. It will be understood that memory controller 1222 could be a physical part of processor 1210 or a physical part of interface 1212. For example, memory controller 1222 can be an integrated memory controller, integrated onto a circuit with processor 1210, such as integrated onto the processor die or a system on a chip.

While not specifically illustrated, it will be understood that system 1200 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1200 includes interface 1214, which can be coupled to interface 1212. Interface 1214 can be a lower speed interface than interface 1212. In one example, interface 1214 represents an interface circuit, which can include standalone components and integrated circuitry. In one example, multiple user interface components or peripheral components, or both, couple to interface 1214. Network interface 1250 provides system 1200 the ability to communicate with remote devices (e.g., servers or other computing devices) over one or more networks. Network interface 1250 can include an Ethernet adapter, wireless interconnection components, cellular network interconnection components, USB (universal serial bus), or other wired or wireless standards-based or proprietary interfaces. Network interface 1250 can exchange data with a remote device, which can include sending data stored in memory or receiving data to be stored in memory.

In one example, system 1200 includes one or more input/output (I/O) interface(s) 1260. I/O interface 1260 can include one or more interface components through which a user interacts with system 1200 (e.g., audio, alphanumeric, tactile/touch, or other interfacing). Peripheral interface 1270 can include any hardware interface not specifically mentioned above. Peripherals refer generally to devices that connect dependently to system 1200. A dependent connection is one where system 1200 provides the software platform or hardware platform or both on which operation executes, and with which a user interacts.

In one example, system 1200 includes storage subsystem 1280 to store data in a nonvolatile manner. In one example, in certain system implementations, at least certain components of storage 1280 can overlap with components of memory subsystem 1220. Storage subsystem 1280 includes storage device(s) 1284, which can be or include any conventional medium for storing large amounts of data in a nonvolatile manner, such as one or more magnetic, solid state, NAND, 3DXP, or optical based disks, or a combination. Storage 1284 holds code or instructions and data 1286 in a persistent state (i.e., the value is retained despite interruption of power to system 1200). Storage 1284 can be generically considered to be a "memory," although memory 1230 is typically the executing or operating memory to provide instructions to processor 1210. Whereas storage 1284 is nonvolatile, memory 1230 can include volatile memory (i.e., the value or state of the data is indeterminate if power is interrupted to system 1200). In one example, storage subsystem 1280 includes controller 1282 to interface with storage 1284. In one example controller 1282 is a physical part of interface 1214 or processor 1210, or can include circuits or logic in both processor 1210 and interface 1214.

Power source 1202 provides power to the components of system 1200. More specifically, power source 1202 typically interfaces to one or multiple power supplies 1204 in system 1200 to provide power to the components of system 1200. In one example, power supply 1204 includes an AC to DC (alternating current to direct current) adapter to plug into a wall outlet. Such AC power can be renewable energy (e.g., solar power) power source 1202. In one example, power source 1202 includes a DC power source, such as an external AC to DC converter. In one example, power source 1202 or power supply 1204 includes wireless charging hardware to charge via proximity to a charging field. In one example, power source 1202 can include an internal battery or fuel cell source.

Figure 13:
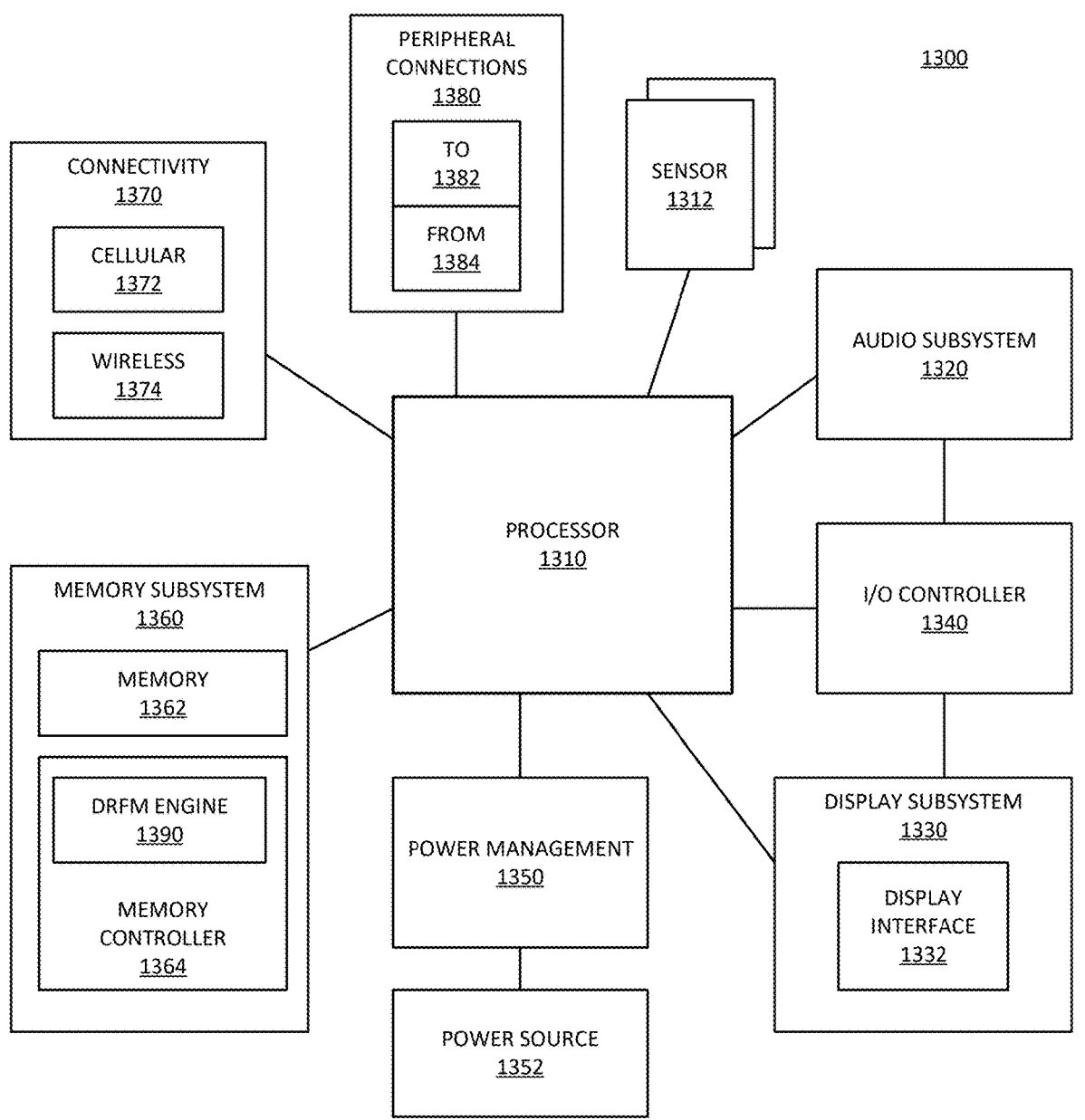
FIG. 13 is a block diagram of an example of a mobile device in which randomized DRFM selection can be implemented.

FIG. 13 is a block diagram of an example of a mobile device in which randomized DRFM selection can be implemented. System 1300 represents a mobile computing device, such as a computing tablet, a mobile phone or smartphone, wearable computing device, or other mobile device, or an embedded computing device. It will be understood that certain of the components are shown generally, and not all components of such a device are shown in system 1300.

System 1300 represents a system in accordance with an example of system 100 or system 200. In one example, memory controller 1364 includes DRFM engine 1390. DRFM engine 1390 enables memory controller 1364 to randomize selection of an activate address to issue a DRFM command for memory 1362 to perform row hammer mitigation. The DRFM command applies to multiple banks of memory 1362. Memory 1362 will perform the row hammer mitigation for each bank based on an address captured for the bank. In one example, memory controller 1364 also randomizes the capturing of the address for the banks with DRFM engine 1390 for use with the DRFM command.

System 1300 includes processor 1310, which performs the primary processing operations of system 1300. Processor 1310 can be a host processor device. Processor 1310 can include one or more physical devices, such as microprocessors, application processors, microcontrollers, programmable logic devices, or other processing means. The processing operations performed by processor 1310 include the execution of an operating platform or operating system on which applications and device functions are executed. The processing operations include operations related to I/O (input/output) with a human user or with other devices, operations related to power management, operations related to connecting system 1300 to another device, or a combination. The processing operations can also include operations related to audio I/O, display I/O, or other interfacing, or a combination. Processor 1310 can execute data stored in memory. Processor 1310 can write or edit data stored in memory.

In one example, system 1300 includes one or more sensors 1312. Sensors 1312 represent embedded sensors or interfaces to external sensors, or a combination. Sensors 1312 enable system 1300 to monitor or detect one or more conditions of an environment or a device in which system 1300 is implemented. Sensors 1312 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1312 can also include sensors for biometric systems such as fingerprint recognition systems, face detection or recognition systems, or other systems that detect or recognize user features. Sensors 1312 should be understood broadly, and not limiting on the many different types of sensors that could be implemented with system 1300. In one example, one or more sensors 1312 couples to processor 1310 via a frontend circuit integrated with processor 1310. In one example, one or more sensors 1312 couples to processor 1310 via another component of system 1300.

In one example, system 1300 includes audio subsystem 1320, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1300, or connected to system 1300. In one example, a user interacts with system 1300 by providing audio commands that are received and processed by processor 1310.

Display subsystem 1330 represents hardware (e.g., display devices) and software components (e.g., drivers) that provide a visual display for presentation to a user. In one example, the display includes tactile components or touchscreen elements for a user to interact with the computing device. Display subsystem 1330 includes display interface 1332, which includes the particular screen or hardware device used to provide a display to a user. In one example, display interface 1332 includes logic separate from processor 1310 (such as a graphics processor) to perform at least some processing related to the display. In one example, display subsystem 1330 includes a touchscreen device that provides both output and input to a user. In one example, display subsystem 1330 includes a high definition (HD) or ultra-high definition (UHD) display that provides an output to a user. In one example, display subsystem includes or drives a touchscreen display. In one example, display subsystem 1330 generates display information based on data stored in memory or based on operations executed by processor 1310 or both.

I/O controller 1340 represents hardware devices and software components related to interaction with a user. I/O controller 1340 can operate to manage hardware that is part of audio subsystem 1320, or display subsystem 1330, or both. Additionally, I/O controller 1340 illustrates a connection point for additional devices that connect to system 1300 through which a user might interact with the system. For example, devices that can be attached to system 1300 might include microphone devices, speaker or stereo systems, video systems or other display device, keyboard or keypad devices, buttons/switches, or other I/O devices for use with specific applications such as card readers or other devices.

As mentioned above, I/O controller 1340 can interact with audio subsystem 1320 or display subsystem 1330 or both. For example, input through a microphone or other audio device can provide input or commands for one or more applications or functions of system 1300. Additionally, audio output can be provided instead of or in addition to display output. In another example, if display subsystem includes a touchscreen, the display device also acts as an input device, which can be at least partially managed by I/O controller 1340. There can also be additional buttons or switches on system 1300 to provide I/O functions managed by I/O controller 1340.

In one example, I/O controller 1340 manages devices such as accelerometers, cameras, light sensors or other environmental sensors, gyroscopes, global positioning system (GPS), or other hardware that can be included in system 1300, or sensors 1312. The input can be part of direct user interaction, as well as providing environmental input to the system to influence its operations (such as filtering for noise, adjusting displays for brightness detection, applying a flash for a camera, or other features).

In one example, system 1300 includes power management 1350 that manages battery power usage, charging of the battery, and features related to power saving operation. Power management 1350 manages power from power source 1352, which provides power to the components of system 1300. In one example, power source 1352 includes an AC to DC (alternating current to direct current) adapter to plug into a wall outlet. Such AC power can be renewable energy (e.g., solar power, motion based power). In one example, power source 1352 includes only DC power, which can be provided by a DC power source, such as an external AC to DC converter. In one example, power source 1352 includes wireless charging hardware to charge via proximity to a charging field. In one example, power source 1352 can include an internal battery or fuel cell source.

Memory subsystem 1360 includes memory device(s) 1362 for storing information in system 1300. Memory subsystem 1360 can include nonvolatile (state does not change if power to the memory device is interrupted) or volatile (state is indeterminate if power to the memory device is interrupted) memory devices, or a combination. Memory 1360 can store application data, user data, music, photos, documents, or other data, as well as system data (whether long-term or temporary) related to the execution of the applications and functions of system 1300. In one example, memory subsystem 1360 includes memory controller 1364 (which could also be considered part of the control of system 1300, and could potentially be considered part of processor 1310). Memory controller 1364 includes a scheduler to generate and issue commands to control access to memory device 1362.

Connectivity 1370 includes hardware devices (e.g., wireless or wired connectors and communication hardware, or a combination of wired and wireless hardware) and software components (e.g., drivers, protocol stacks) to enable system 1300 to communicate with external devices. The external device could be separate devices, such as other computing devices, wireless access points or base stations, as well as peripherals such as headsets, printers, or other devices. In one example, system 1300 exchanges data with an external device for storage in memory or for display on a display device. The exchanged data can include data to be stored in memory, or data already stored in memory, to read, write, or edit data.

Connectivity 1370 can include multiple different types of connectivity. To generalize, system 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1374 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1380 include hardware interfaces and connectors, as well as software components (e.g., drivers, protocol stacks) to make peripheral connections. It will be understood that system 1300 could both be a peripheral device ("to" 1382) to other computing devices, as well as have peripheral devices ("from" 1384) connected to it. System 1300 commonly has a "docking" connector to connect to other computing devices for purposes such as managing (e.g., downloading, uploading, changing, synchronizing) content on system 1300. Additionally, a docking connector can allow system 1300 to connect to certain peripherals that allow system 1300 to control content output, for example, to audiovisual or other systems.

In addition to a proprietary docking connector or other proprietary connection hardware, system 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 14:
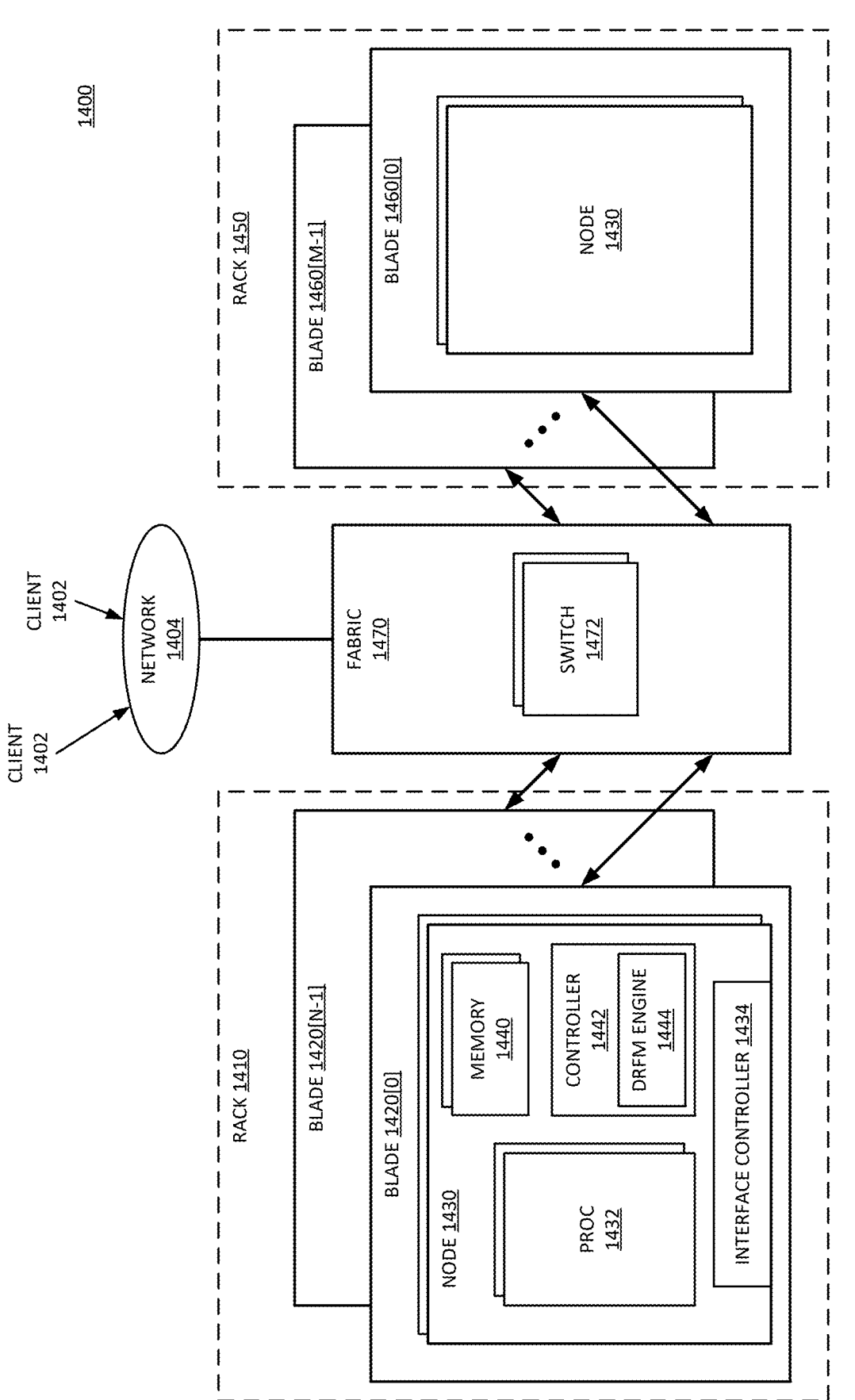
FIG. 14 is a block diagram of an example of a multi-node network in which randomized DRFM selection can be implemented.

FIG. 14 is a block diagram of an example of a multi-node network in which randomized DRFM selection can be implemented. System 1400 represents a network of nodes that can apply adaptive ECC. In one example, system 1400 represents a data center. In one example, system 1400 represents a server farm. In one example, system 1400 represents a data cloud or a processing cloud.

Node represents a system in accordance with an example of system 100 or system 200. Node 1430 includes memory 1440. Node 1430 includes controller 1442, which represents a memory controller to manage access to memory 1440. In one example, controller 1442 includes DRFM engine 1444. DRFM engine 1444 enables controller 1442 to randomize selection of an activate address to issue a DRFM command for memory 1440 to perform row hammer mitigation. The DRFM command applies to multiple banks of memory 1440. Memory 1440 will perform the row hammer mitigation for each bank based on an address captured for the bank. In one example, controller 1442 also randomizes the capturing of the address for the banks with DRFM engine 1444 for use with the DRFM command.

One or more clients 1402 make requests over network 1404 to system 1400. Network 1404 represents one or more local networks, or wide area networks, or a combination. Clients 1402 can be human or machine clients, which generate requests for the execution of operations by system 1400. System 1400 executes applications or data computation tasks requested by clients 1402.

In one example, system 1400 includes one or more racks, which represent structural and interconnect resources to house and interconnect multiple computation nodes. In one example, rack 1410 includes multiple nodes 1430. In one example, rack 1410 hosts multiple blade components 1420. Hosting refers to providing power, structural or mechanical support, and interconnection. Blades 1420 can refer to computing resources on printed circuit boards (PCBs), where a PCB houses the hardware components for one or more nodes 1430. In one example, blades 1420 do not include a chassis or housing or other "box" other than that provided by rack 1410. In one example, blades 1420 include housing with exposed connector to connect into rack 1410. In one example, system 1400 does not include rack 1410, and each blade 1420 includes a chassis or housing that can stack or otherwise reside in close proximity to other blades and allow interconnection of nodes 1430.

System 1400 includes fabric 1470, which represents one or more interconnectors for nodes 1430. In one example, fabric 1470 includes multiple switches 1472 or routers or other hardware to route signals among nodes 1430. Additionally, fabric 1470 can couple system 1400 to network 1404 for access by clients 1402. In addition to routing equipment, fabric 1470 can be considered to include the cables or ports or other hardware equipment to couple nodes 1430 together. In one example, fabric 1470 has one or more associated protocols to manage the routing of signals through system 1400. In one example, the protocol or protocols is at least partly dependent on the hardware equipment used in system 1400.

As illustrated, rack 1410 includes N blades 1420. In one example, in addition to rack 1410, system 1400 includes rack 1450. As illustrated, rack 1450 includes M blades 1460. M is not necessarily the same as N; thus, it will be understood that various different hardware equipment components could be used, and coupled together into system 1400 over fabric 1470. Blades 1460 can be the same or similar to blades 1420. Nodes 1430 can be any type of node and are not necessarily all the same type of node. System 1400 is not limited to being homogenous, nor is it limited to not being homogenous.

For simplicity, only the node in blade 1420[0] is illustrated in detail. However, other nodes in system 1400 can be the same or similar. At least some nodes 1430 are computation nodes, with processor (proc) 1432 and memory 1440. A computation node refers to a node with processing resources (e.g., one or more processors) that executes an operating system and can receive and process one or more tasks. In one example, at least some nodes 1430 are server nodes with a server as processing resources represented by processor 1432 and memory 1440. A storage server refers to a node with more storage resources than a computation node, and rather than having processors for the execution of tasks, a storage server includes processing resources to manage access to the storage nodes within the storage server.

In one example, node 1430 includes interface controller 1434, which represents logic to control access by node 1430 to fabric 1470. The logic can include hardware resources to interconnect to the physical interconnection hardware. The logic can include software or firmware logic to manage the interconnection. In one example, interface controller 1434 is or includes a host fabric interface, which can be a fabric interface in accordance with any example described herein.

Processor 1432 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1440 can be or include memory devices and a memory controller.

In general with respect to the descriptions herein, in one aspect, a memory controller includes: a hardware interface to couple to a memory device having multiple banks; and control circuitry to generate first commands to indicate addresses for a plurality of the multiple banks for the memory device to capture for a pseudo target row refresh (pTRR) operation of the multiple banks; and generate a second command, a directed refresh management (DRFM) command, to trigger the memory device to perform target row refresh mitigation for the multiple banks based on the addresses for the plurality of the multiple banks.

In one example of the memory controller, the control circuitry is to randomize how frequently to send the second command to the memory device. In accordance with any preceding example of the memory controller, in one example, the first commands comprise Precharge commands to indicate the addresses. In accordance with any preceding example of the memory controller, in one example, the first commands comprise read with auto-precharge (RDA) or write with auto-precharge (WRA) to indicate the addresses. In accordance with any preceding example of the memory controller, in one example, each of the first commands includes a field in command encoding to indicate whether to capture or not capture an address indicated in the command.

In accordance with any preceding example of the memory controller, in one example, the second command comprises an all bank DRFM command (DRFMab). In accordance with any preceding example of the memory controller, in one example, the second command comprises a same bank DRFM command (DRFMsb). In accordance with any preceding example of the memory controller, in one example, the control circuitry is to generate the first commands to indicate addresses with more frequency than the second command to trigger target row refresh mitigation. In accordance with any preceding example of the memory controller, in one example, to generate the first commands with more frequency comprises generate the first commands at least an order of magnitude more frequently than the second command. In accordance with any preceding example of the memory controller, in one example, the control circuitry is to generate the first commands on every precharge, and generate the second command based on a linear feedback shift register (LFSR) based on activate commands. In accordance with any preceding example of the memory controller, in one example, the control circuitry is to generate the first commands based on a high insertion linear feedback shift register (LFSR) based on activate commands, and generate the second command based on a low insertion LFSR based on the activate commands. In accordance with any preceding example of the memory controller, in one example, the control circuitry is to generate the first commands for every first activate command for each of the plurality of banks after a DRFM command, then generate subsequent first commands for each of the plurality of banks based on a high insertion linear feedback shift register (LFSR) based on activate commands, and generate the second command based on a low insertion LFSR based on the activate commands. In accordance with any preceding example of the memory controller, in one example, the control circuitry is to randomize generation of the first commands and randomize generation of the second command. In accordance with any preceding example of the memory controller, in one example, the control circuitry is to generate the second command based on a pseudorandom timer. In accordance with any preceding example of the memory controller, in one example, the control circuitry is to generate the first commands and the second command based on a linear feedback shift register based on occurrence of an activate command.

In general with respect to the descriptions herein, in one aspect, a system includes: a memory device having multiple banks; and a memory controller to generate first commands to indicate addresses for a plurality of the multiple banks for the memory device to capture for a pseudo target row refresh (pTRR) operation of the multiple banks, and generate a second command, a directed refresh management (DRFM) command, to trigger the memory device to perform target row refresh mitigation for the multiple banks based on the addresses for the plurality of the multiple banks.

In one example of the system, the memory controller is to randomize how frequently to send the second command to the memory device. In accordance with any preceding example of the system, in one example, the memory controller is to generate the first commands on every precharge, and generate the second command based on a linear feedback shift register (LFSR) based on activate commands. In accordance with any preceding example of the system, in one example, the memory controller is to generate the first commands based on a high insertion linear feedback shift register (LFSR) based on activate commands, and generate the second command based on a low insertion LFSR based on the activate commands. In accordance with any preceding example of the system, in one example, the first commands comprise Precharge commands to indicate the addresses. In accordance with any preceding example of the system, in one example, the first commands comprise read with auto-precharge (RDA) or write with auto-precharge (WRA) to indicate the addresses. In accordance with any preceding example of the system, in one example, each of the first commands includes a field in command encoding to indicate whether to capture or not capture an address indicated in the command. In accordance with any preceding example of the system, in one example, the second command comprises an all bank DRFM command (DRFMab). In accordance with any preceding example of the system, in one example, the second command comprises a same bank DRFM command (DRFMsb). In accordance with any preceding example of the system, in one example, the memory controller is to generate the first commands to indicate addresses with more frequency than the second command to trigger target row refresh mitigation. In accordance with any preceding example of the system, in one example, to generate the first commands with more frequency comprises generate the first commands at least an order of magnitude more frequently than the second command. In accordance with any preceding example of the system, in one example, the memory controller is to generate the first commands on every precharge, and generate the second command based on linear feedback shift register (LFSR) based on activate commands. In accordance with any preceding example of the system, in one example, the memory controller is to generate the first commands based on a high insertion linear feedback shift register (LFSR) based on activate commands, and generate the second command based on a low insertion LFSR based on the activate commands. In accordance with any preceding example of the system, in one example, the memory controller is to generate the first commands for every first activate command for each of the plurality of banks after a DRFM command, then generate subsequent first commands for each of the plurality of banks based on a high insertion linear feedback shift register (LFSR) based on activate commands, and generate the second command based on a low insertion LFSR based on the activate commands. In accordance with any preceding example of the system, in one example, the memory controller is to randomize generation of the first commands and randomize generation of the second command. In accordance with any preceding example of the system, in one example, the memory controller is to generate the second command based on a pseudorandom timer. In accordance with any preceding example of the system, in one example, the memory controller is to generate the first commands and the second command based on a linear feedback shift register based on occurrence of an activate command. In accordance with any preceding example of the system, in one example, the system includes one or more of: a multicore host processor coupled to the memory controller; a display communicatively coupled to a host processor; a network interface communicatively coupled to a host processor; or a battery to power the system.

In general with respect to the descriptions herein, in one aspect, a method includes: generating first commands to indicate addresses for a plurality of multiple banks for a memory device to capture for a pseudo target row refresh (pTRR) operation of the multiple banks; and generating a second command, a directed refresh management (DRFM) command, to trigger the memory device to perform target row refresh mitigation for the multiple banks based on the addresses for the plurality of the multiple banks.

In one example of the method, triggering the memory device to perform target row refresh mitigation includes randomizing how frequently to send the second command to the memory device. In accordance with any preceding example of the method, in one example, generating the second command comprises generating the DRFM command based on a linear feedback shift register (LFSR) based on activate commands. In accordance with any preceding example of the method, in one example, generating the first commands comprises generating the first commands including randomizing how frequently to send the first commands to the memory device to indicate the addresses. In accordance with any preceding example of the method, in one example, the first commands comprise Precharge commands to indicate the addresses. In accordance with any preceding example of the method, in one example, the first commands comprise read with auto-precharge (RDA) or write with auto-precharge (WRA) to indicate the addresses. In accordance with any preceding example of the method, in one example, each of the first commands includes a field in command encoding to indicate whether to capture or not capture an address indicated in the command. In accordance with any preceding example of the method, in one example, the second command comprises an all bank DRFM command (DRFMab). In accordance with any preceding example of the method, in one example, the second command comprises a same bank DRFM command (DRFMsb). In accordance with any preceding example of the method, in one example, generating the first commands comprises generating the first commands to indicate addresses with more frequency than the second command to trigger target row refresh mitigation. In accordance with any preceding example of the method, in one example, generating the first commands with more frequency comprises generating the first commands at least an order of magnitude more frequently than the second command. In accordance with any preceding example of the method, in one example, generating the first commands comprises generating the first commands on every precharge, and generating the second command comprises generating the DRFM command based on linear feedback shift register (LFSR) based on activate commands. In accordance with any preceding example of the method, in one example, generating the first commands comprises generating the first commands based on a high insertion linear feedback shift register (LFSR) based on activate commands, and generating the second command comprises generating the DRFM command based on a low insertion LFSR based on the activate commands. In accordance with any preceding example of the method, in one example, generating the first commands comprises generating the first commands for every first activate command for each of the plurality of banks after a DRFM command, then generating subsequent first commands for each of the plurality of banks based on a high insertion linear feedback shift register (LFSR) based on activate commands, and wherein generating the second command comprises generating the DRFM command based on a low insertion LFSR based on the activate commands. In accordance with any preceding example of the method, in one example, wherein generating the first commands comprises randomizing a frequency of generation of the first commands and wherein generating the second command comprises randomizing a frequency of generation of the second command. In accordance with any preceding example of the method, in one example, wherein generating the second command comprises generating the DRFM command based on a pseudorandom timer. In accordance with any preceding example of the method, in one example, generating the first commands comprises generating the first commands based on a linear feedback shift register (LFSR) based on occurrence of an activate command, and generating the second command comprises generating the DRFM command based on the LFSR based on occurrence of the activate command.

In general with respect to the descriptions herein, in one aspect, a memory device includes: multiple banks of memory; and a hardware interface to couple to a memory controller, to receive first commands to indicate addresses for a plurality of the multiple banks for the memory device and to receive a second command, a directed refresh management (DRFM) command; multiple registers, including a register for each of the plurality of banks, to capture the addresses per bank for a pseudo target row refresh (pTRR) operation of the multiple banks; and refresh hardware to perform target row refresh mitigation for the multiple banks based on the addresses captured in the multiple registers.

In one example of the memory device, a frequency of receipt of the DRFM command is randomized by the memory controller. In accordance with any preceding example of the memory device, in one example, the first commands comprise Precharge commands to indicate the addresses. In accordance with any preceding example of the memory device, in one example, the first commands comprise read with auto-precharge (RDA) or write with auto-precharge (WRA) to indicate the addresses. In accordance with any preceding example of the memory device, in one example, each of the first commands includes a field in command encoding to indicate whether to capture or not capture an address indicated in the command. In accordance with any preceding example of the memory device, in one example, the second command comprises an all bank DRFM command (DRFMab). In accordance with any preceding example of the memory device, in one example, the second command comprises a same bank DRFM command (DRFMsb). In accordance with any preceding example of the memory device, in one example, the frequency of receipt of the DRFM command is less frequent than receipt of the first commands to indicate addresses. In accordance with any preceding example of the memory device, in one example, the frequency of receipt of the first commands is at least an order of magnitude more than the frequency of receipt of the DRFM command. In accordance with any preceding example of the memory device, in one example, the first commands are associated with every precharge for the memory device, and the DRFM command is received based on a linear feedback shift register (LFSR) based on activate commands. In accordance with any preceding example of the memory device, in one example, receipt of the first commands is based on a high insertion linear feedback shift register (LFSR) based on activate commands, and receipt of the DRFM command is based on a low insertion LFSR based on the activate commands. In accordance with any preceding example of the memory device, in one example, receipt of the first commands occurs for every first activate command for each of the plurality of banks after a DRFM command, then receipt of subsequent first commands for each of the plurality of banks is based on a high insertion linear feedback shift register (LFSR) based on activate commands, and receipt of the DRFM command is based on a low insertion LFSR based on the activate commands. In accordance with any preceding example of the memory device, in one example, receipt of the first commands is randomized by the memory controller, and receipt of the DRFM command is randomized by the memory controller. In accordance with any preceding example of the memory device, in one example, receipt of the DRFM command is based on a pseudorandom timer. In accordance with any preceding example of the memory device, in one example, receipt of the first commands and receipt of the DRFM command are based on a linear feedback shift register based on occurrence of an activate command.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:

a hardware interface to couple to a memory device having multiple banks; and control circuitry to generate first commands to indicate addresses for a plurality of the multiple banks for the memory device to capture for a pseudo target row refresh (pTRR) operation of the multiple banks, where the plurality of the multiple banks pseudorandomly capture addresses for target row refresh operation; and generate a second command, a directed refresh management (DRFM) command, after the plurality of the multiple banks have pseudorandomly captured the addresses for target row refresh operation, to trigger the memory device to perform target row refresh mitigation for the multiple banks based on the addresses pseudorandomly captured for the plurality of the multiple banks.

2. The memory controller of claim 1, wherein the first commands comprise Precharge commands to indicate the addresses.

3. The memory controller of claim 1, wherein the first commands comprise read with auto-precharge (RDA) or write with auto-precharge (WRA) to indicate the addresses.

4. The memory controller of claim 1, wherein each of the first commands includes a field in command encoding to indicate whether to capture or not capture an address indicated in the command.

5. The memory controller of claim 1, wherein the second command comprises an all bank DRFM command (DRFMab).

6. The memory controller of claim 1, wherein the second command comprises a same bank DRFM command (DRFMsb).

7. The memory controller of claim 1, wherein the control circuitry is to generate the first commands to indicate addresses with more frequency than the second command to trigger target row refresh mitigation.

8. The memory controller of claim 7, wherein to generate the first commands with more frequency comprises generate the first commands at least an order of magnitude more frequently than the second command.

9. The memory controller of claim 7, wherein the control circuitry is to generate the first commands on every precharge, and generate the second command based on linear feedback shift register (LFSR) based on activate commands.

10. The memory controller of claim 7, wherein the control circuitry is to generate the first commands based on a high insertion linear feedback shift register (LFSR) based on activate commands, and generate the second command based on a low insertion LFSR based on the activate commands.

11. The memory controller of claim 7, wherein the control circuitry is to generate the first commands for every first activate command for each of the plurality of banks after a DRFM command, then generate subsequent first commands for each of the plurality of banks based on a high insertion linear feedback shift register (LFSR) based on activate commands, and generate the second command based on a low insertion LFSR based on the activate commands.

12. The memory controller of claim 1, wherein the control circuitry is to randomize how frequently to send the second command to the memory device.

13. The memory controller of claim 12, wherein the control circuitry is to randomize a frequency of generation of the first commands and randomize a frequency of generation of the second command.

14. The memory controller of claim 13, wherein the control circuitry is to generate the second command based on a pseudorandom timer.

15. The memory controller of claim 13, wherein the control circuitry is to generate the first commands and the second command based on a linear feedback shift register based on occurrence of an activate command.

16. A system comprising:

a memory device having multiple banks; and a memory controller to generate first commands to indicate addresses for a plurality of the multiple banks for the memory device to capture for a pseudo target row refresh (pTRR) operation of the multiple banks, where the plurality of the multiple banks pseudorandomly capture addresses for target row refresh operation, and generate a second command, a directed refresh management (DRFM) command, after the plurality of the multiple banks have pseudorandomly captured the addresses for target row refresh operation, to trigger the memory device to perform target row refresh mitigation for the multiple banks based on the addresses pseudorandomly captured for the plurality of the multiple banks.

17. The system of claim 16, wherein the memory controller is to randomize how frequently to send the second command to the memory device.

18. The system of claim 17, wherein the memory controller is to randomize a frequency of generation of the first commands and randomize a frequency of generation of the second command.

19. The system of claim 16, wherein the memory controller is to generate the first commands on every precharge, and generate the second command based on a linear feedback shift register (LFSR) based on activate commands.

20. The system of claim 16, wherein the memory controller is to generate the first commands based on a high insertion linear feedback shift register (LFSR) based on activate commands, and generate the second command based on a low insertion LFSR based on the activate commands.

21. The system of claim 16, further comprising one or more of:

a multicore host processor coupled to the memory controller;

a display communicatively coupled to a host processor;

a network interface communicatively coupled to a host processor; or a battery to power the system.

22. A method comprising:

generating first commands to indicate addresses for a plurality of multiple banks for a memory device to capture for a pseudo target row refresh (pTRR) operation of the multiple banks, where the plurality of the multiple banks pseudorandomly capture addresses for target row refresh operation; and generating a second command, a directed refresh management (DRFM) command, after the plurality of the multiple banks have pseudorandomly captured the addresses for target row refresh operation, to trigger the memory device to perform target row refresh mitigation for the multiple banks based on the addresses pseudorandomly captured for the plurality of the multiple banks.

23. The method of claim 22, wherein generating the second command includes randomizing how frequently to send the second command to the memory device.

24. The method of claim 22, wherein generating the second command comprises generating the DRFM command based on a linear feedback shift register (LFSR) based on activate commands.

25. The method of claim 22, wherein generating the first commands comprises generating the first commands including randomizing how frequently to send the first commands to the memory device to indicate the addresses.

\* \* \* \* \*